(12) United States Patent
Mutoh et al.

(10) Patent No.: US 7,176,972 B2
(45) Date of Patent: Feb. 13, 2007

(54) FAST IMAGING DEVICE AND FAST PHOTOGRAPHING DEVICE

(75) Inventors: Hideki Mutoh, Odawara (JP); Takeharu Etoh, Mino (JP)

(73) Assignees: Link Research Corporation, Tokyo (JP); Hispec Goushi Kaisha, Osaka (JP); Shimadzu Corporation, Kyoto (JP)

( * ) Notice: Subject to any disclaimer, the term of this patent is extended or adjusted under 35 U.S.C. 154(b) by 759 days.

(21) Appl. No.: 10/240,108

(22) PCT Filed: Mar. 28, 2001

(86) PCT No.: PCT/JP01/02531

§ 371 (c)(1),
(2), (4) Date: Nov. 27, 2002

(87) PCT Pub. No.: WO01/73849
PCT Pub. Date: Oct. 4, 2001

(65) Prior Publication Data
US 2003/0089908 A1 May 15, 2003

(30) Foreign Application Priority Data
Mar. 28, 2000 (JP) .............................. 2000-132983

(51) Int. Cl.
*H04N 3/14* (2006.01)
*H04N 5/335* (2006.01)
(52) U.S. Cl. ...................... 348/315; 348/319; 348/312; 348/320
(58) Field of Classification Search ................ 257/225, 257/231, 232; 348/294, 311–315, 319, 320, 348/324
See application file for complete search history.

(56) References Cited

U.S. PATENT DOCUMENTS

| 4,811,068 | A | * | 3/1989 | Kinoshita | 257/232 |
|---|---|---|---|---|---|
| 5,355,165 | A | | 10/1994 | Kosonocky et al. | |
| 6,118,483 | A | * | 9/2000 | Etoh | 348/315 |
| 6,236,434 | B1 | * | 5/2001 | Yamada | 348/315 |
| 6,847,401 | B1 | * | 1/2005 | Ohtsuru | 348/317 |
| 6,972,795 | B1 | * | 12/2005 | Etoh et al. | 348/311 |

FOREIGN PATENT DOCUMENTS

| EP | 1041637 A | 10/2000 |
|---|---|---|
| JP | 56-132875 A | 10/1981 |
| JP | 58-209269 A | 12/1983 |
| JP | 60-028265 | 2/1985 |
| JP | 11-225288 A | 8/1999 |
| JP | 2000-165750 | 6/2000 |
| WO | WO 00/17930 | 3/2000 |

* cited by examiner

*Primary Examiner*—Ngoc-Yen Vu
*Assistant Examiner*—Dan Pasiewicz
(74) *Attorney, Agent, or Firm*—Birch, Stewart, Kolasch & Birch, LLP

(57) ABSTRACT

A fast imaging device 32 has a charge signal converter 33, a charge signal accumulator 36 and a charge signal transporter 37. A charge signal accumulator 36 is provided to each charge signal converter 33. A charge signal accumulator 36 extends linearly while inclining with respect to a line L2 connecting charge signal converter 33. The other end of a charge signal accumulator 36, connected at one end thereof to a charge signal converter 33 constituting a corresponding column, merges to a charge signal transporter 37. This construction reduces noise and increases a frame rate.

8 Claims, 22 Drawing Sheets

CONVENTIONAL ART

FAST IMAGING DEVICE AND FAST PHOTOGRAPHING DEVICE

This application is the national phase under 35 U.S.C. § 371 of PCT International Application No. PCT/JP01/02531 which has an International filing date of Mar. 28, 2001, which designated the United States of America.

TECHNICAL FIELD

The present invention relates to a high speed image sensor and a high speed image capturing apparatus suitable for capturing images of high speed phenomena, such as demolitions, explosions, high speed flows, collisions, and the like.

BACKGROUND TECHNOLOGY

A parallel read-out type high speed image sensor that simultaneously reads out charge signals from a plurality of read-out lines is utilized in order to capture high speed images. However, an in-situ storage image sensor is suitable for further increasing image capturing speed. The in-situ storage image sensor serially overwrites charge signals to image signal storages provided in the periphery of each pixel for recording during image capturing without reading-out the charge signals. The in-situ storage image sensor records charge signals in parallel simultaneously in all of the pixels as analog signals, thereby achieving a great increase in image capturing speed.

The present inventor has previously proposed an in-situ storage image sensor (slanted CCD-type image sensor) provided with charge signal storages made of linear charge coupled devices slantly extending from each of photodiodes having comparatively great areas (see Japanese unexamined patent publication 2000-165750).

FIG. 11 shows the principle of this slanted CCD-type image sensor. In FIG. 11, photodiodes are denoted as 1, CCD charge storages respectively provided with a plurality of elements 2a are denoted as 2, and drain gates are denoted as 4. Charge signals generated in each photodiode 1 are stored in elements 2a of the corresponding CCD charge accumulator 2 according to the order of generation (image capture order), as shown by numerals 1 to 5 attached to elements 2a in FIG. 11.

The slant of the CCD charge storage 2 with respect to the center axis line L1 of photodiodes 1 is significant feature.

If the CCD charge storages 2 extended parallel to the center axis line L2 of photodiodes 1, the CCD charge storage 2 extending from one photodiode 1 would need to be shifted to the right in the figure by the width of one CCD charge storage 2 for preventing interference with the photodiode 1 located directly below this photodiode 1 in the figure. As a result, in the case of FIG. 12, the row direction and the columnar direction of photodiodes 1 are not perpendicular to each other so that the arrangement of photodiodes 1 is distorted. In contrast to this, in the case of FIG. 11, since CCD charge storage 2 are slanted with respect to the center axis line L1 as described above, photodiodes 1 can be arranged so that both rows and columns have constant intervals and the row direction (direction of X axis) and the columnar direction (direction of Y axis) are perpendicular to each other. In other words, photodiodes 1 can be arranged in a right-angled grid pattern.

FIG. 13 shows one example of the above described slanted CCD-type image sensor. Each CCD charge accumulator 2 extends from the upper edge to the lower edge of the photo-receptive area in a gradually meandering manner and passes through regions 8 in gaps between two photodiodes 1 adjacent to each other in the columnar direction. Further, each CCD charge accumulator 2 is divided into segments corresponding to the number of regions 8 between photodiodes 1 that each CCD charge accumulator 2 passes through. Each of segments has input gate 3 at its upper end and a drain gate 4 at its lower end. Furthermore, the lowest edge of each CCD charge storages 2 is connected to a horizontal read-out CCD 6 provided outside of the photo-receptive area.

At the time of image capturing, the charge signals produced in each photodiode 1 are transferred by the corresponding CCD charge storage 2 and discharged out of the sensor from the drain gate 4. Further, at the time of reading-out, the input gate 3 and the drain gate 4 are closed so that charge signals in each CCD charge storage 2 are transferred to the horizontal read-out CCD 6. After that, the charge signals are read out from the sensor by the horizontal read-out CCD 6 through an amplifier 7.

Then, driving voltages for transferring charge signal through a CCD charge transfer path will be described.

FIGS. 14 to 18 respectively show typical patterns of the driving voltages. As shown in FIGS. 14A to 18A, electrodes 11a, 11b, 11c and 11d usually made of polysilicon are provided on the photo-receptive area, and driving voltages are supplied to these electrodes 11a to 11d via metal wires 12a, 12b, 12c, and 12d provided on the photo-receptive area. FIGS. 14B to 18B show the relationship between the position on the CCD charge transfer paths 10 in the direction of extension and the potential, and FIGS. 14C to 18C show the relationship between time and variation in the driving voltage.

FIG. 14 shows the case of a driving voltage having three levels and three phases, and FIG. 15 shows the case of a driving voltage having two levels and three phases. In these cases, three types of electrodes 11a to 11c respectively corresponding to phase φ1, φ2, and φ3 are needed. In the case of FIG. 15, a voltage variation of 6 steps is needed as shown in Steps S0 to S6 in order to transfer a charge signal from one element 10a to the next element 10a. FIG. 16 shows the case of a driving voltage having two levels and four phases wherein four types of electrodes 11a to 11d corresponding to phase φ1, φ2, φ3, and φ4 are needed. In these cases, of FIGS. 14 to 16, it is not necessary to change the impurity doping profile in CCD charge transfer path 10 in the direction of charge transfer and CCD charge transfer paths 10 constituted only by N regions are provided in a substrate of a P region. According to these systems of FIGS. 14 to 16, the amount of charge that can be transferred is great so that a great dynamic range can be secured, but they are not suitable for high speed transfer.

On the other hand, FIG. 17 shows the case of a driving voltage having two levels and two phases, while FIG. 18 shows the case of a driving voltage having two levels and one phase. In these cases, portions of having low levels of impurity dopants and portions having high levels of impurity dopants are formed in alternation in the surface of CCD charge transfer path 10, therefor previously creating unevenness of the potential gradient in the direction of transfer of charge signals. Thus, when a driving voltage is applied to electrodes 11a and 11b, a potential profile in a step form is formed so that the charges are transferred to the downstream side due to inclinations in this potential profile. According to these systems of FIGS. 17 and 18, the amount of charges that can be transferred is small, but they are suitable for high speed transfer.

It is necessary to generate many charge signals in small pixels within a photo-receptive area of an image sensor and, therefore, it is preferable for the CCD charge storage to be able to transfer a great number of charges. On the other hand, high speed is required in the horizontal read-out CCD located outside of the photo-receptive area. In addition, since the horizontal read-out CCD is located outside of the photo-receptive area, the amount of transferred charges can be increased by increasing the width due to the existence of extra space.

Accordingly, systems of FIGS. 17 and 18 are ordinarily adopted for the CCD charge storage 2 within a photo-receptive area, while systems of FIGS. 14 to 16 are ordinarily adopted for the horizontal read-out CCD 6.

The same number of types of metal wires for supplying a driving voltage to CCD charge transfer paths are necessary as the number of phases of the driving voltage. Further, since the same type of metal wires need to be arranged in the same layer, cross arrangement of different types of metal wires requires arrangement of the different types of metal wires in two different layers isolated from each other. Furthermore, in the case of an image sensor, it is necessary to place metal wires for supplying a control voltage to an input gate and a drain gate.

FIGS. 19A to 19E show examples wherein electrodes 11a to 11c and metal wires 12a to 12c for supplying driving voltages to CCD charge storages of the image sensor are placed in the same metal layer. FIG. 19A shows the case wherein a driving voltage has one phase, FIG. 19B shows the case wherein a driving voltage has two phases, and FIG. 19C shows the case wherein a driving voltage has three phases. Further, FIG. 19D shows the case wherein the driving voltage has three phases and one type of metal wire 13a for supplying a control voltage is placed in the same layer as metal wires 11a to 11c. Furthermore, FIG. 19E shows the case wherein a driving voltage has three phases and two types of metal wires 13a and 13b for supplying a control voltage are placed in the same layer as metal wires 11a to 11c. In these figures, contact points are denoted as 17.

DISCLOSURE OF THE INVENTION

The above described diagonal CCD-type image sensor shown in FIG. 13 has following problems.

First, large areas of photodiodes 1 for enhancement of the sensitivity arouse need for making regions 8 between two photodiodes 1 adjacent to each other in the columnar direction very narrow. However, it is difficult to provide CCD charge storages 2 so that they pass through narrow gaps 8 in the point of view of manufacturing. In addition, at the time when the charge signals are shifted in the CCD charge storage 2, noise occurs at these narrow regions 8.

Second, the slanted CCD-type image sensor of FIG. 13 has a triangular region 14 in the lower left in the figure of the photo-receptive area, wherein only CCD charge storages 2 exist and no photodiodes 1 exist. Because of the existence of this triangular region 14, the image sensor becomes of a large size. In addition, in the case that the same area is provided for the photo-receptive area, existence of the triangular region 14 decreases the number of photodiodes 14, therefore reducing the resolution.

Third, increasing number of types of metal wires for supplying driving voltages and control voltages reducing the frame rate. This point will be described below.

As shown in FIGS. 19A to 19E, the distance 15 between metal wires of same phase increases as the number of types of metal wires increases. For example, as shown in FIGS. 19A to 19C, in the case that only metal wires 12a to 12c for supplying a driving voltage are provided, distances 15 for the driving voltages of one phase, two phase, and three phases are respectively one time, two times, and three times of the channel pitch (sum of the width of the CCD charge storage and the width of a channel stop). The voltage transfer distances become ½ of distances 15. Further, as shown in FIGS. 19D and 19E, in the case that metal wires. 13a and 13b for supplying the control voltage are provided, distance 15 becomes greater. On the other hand, the time delay of the middle points between the contacts 17 in the electrodes 11a, 11b, and 11c comparing the contacts 17 is proportional to the product RC of electrical resistance R of electrodes 11a to 11c and electrical capacitance C of the layer located on the lower side of electrodes 11c. Further, the electrical resistance R and electrical capacitance C are proportional to the distance. Accordingly, the time delay of voltage transfer of the middle points between the contacts 17 in the electrodes 11a, 11b, and 11c comparing the contacts 17 is proportional to the square of distance 15. As described above, when the number of types of metal wires increases, the time delay of voltage transfer increases, causing reduction of the frame rate. The effects of the above described time delay on the frame rate become conspicuous when the frame rate reaches the order of one million frames/second.

If the number of metal layers for providing metal wires were increased, the time delay of voltage transfer could be reduced by reduction of distance 15. However, increasing the number of layers causes the lowering of product quality, such as increase in noise, and lowering of yield. Therefore, the maximum number of metal layers is approximately three. Further, it is necessary to provide a light blocking layer made of metal as the top layer and, therefore the number of metal layers that can provide metal wires becomes two at a maximum. In addition, in the slanted CCD-type image sensor, the increase in the number of layers has a great effect on the yield, in comparison with the normal image sensor. Specifically, the yield of image sensors is proportional to the square of the areas. In addition, in contrast to the normal image sensor of square shape having sides of approximately several millimeters, the slanted CCD-type image sensor provided with a great number of elements for each pixel is a square shape having sides of approximately two centimeters. Thus, slanted CCD-type image sensor has a large area in comparison with the usual image sensor. Accordingly, an increase in the number of layers has a great effect on the yield, in the slanted CCD-type image sensor.

Therefore, an objective of the present invention is to achieve a reduction in noise, an increase in resolution, an increase in frame rate, and an increase in yield in a slanted CCD-type image sensor.

In order to solve the above described problems, a first aspect of the present invention provides a high speed image sensor, comprising: a plurality of charge signal converters forming rows at constant intervals and columns at constant intervals, arranged in a photo-receptive area so that the row direction and the columnar direction are perpendicular to each other, and respectively generating a charge signal according to the intensity of incident beam; a plurality of charge signal storages, respectively provided for each of the charge signal converters with one end thereof being connected to the corresponding charge signal converter, extending in linear so as to be slanted with respect to a line connecting adjacent charge signal converters in the column direction, and transferring charge signals generated by the corresponding charge signal converter from one end to the other end; and a plurality of charge signal transfers, respectively provided for each column of charge signal converters so that the other ends of the charge signal storages with the one ends connected to charge signal converters constituting the corresponding column are merged to the charge signal transfer, and transferring charge signals that have been transferred from these charge signal storages to the outside of the photo-receptive area.

In the high speed image sensor of the present invention charge signal storages do not pass through regions between charge signal converters adjacent to each other in the columnar direction. Therefore, noise occurring at the time when the charge signals are transferred in the charge signal storages can be reduced. Further, the charge signals can be read out from the sensor without the occurrence of noise by the charge signal transfers after the completion of image capture.

Specifically, it is preferable for the charge signal transfers to extend in the columnar direction of the charge signal converters.

The photo-receptive area becomes of a rectangular form without a triangular region at its corner so that miniaturization of the sensor can be achieved. Further, in the case that the same area is provided, the number of charge signal converters increases because of the absence of this triangular area, thereby increasing the resolution.

Further, it is preferable that the direction of transfer of charges through said charge signal storages and the direction of transfer of charge through said charge signal transfers are substantially same at points where said charge signal storages merge to said charge signal transfers.

Furthermore, it is preferable that said charge signal storages are formed of first charge coupled devices, said charge signal transfers are formed of second charge coupled devices, the high speed image sensor is provided with a plurality of electrodes including at least two types for supplying a driving voltage to said first charge coupled devices and a plurality of electrodes including at least two types for supplying a driving voltage to said second charge coupled devices, and at least one type of the electrode among the electrodes for supplying the driving voltage to said second charge coupled devices is the same electrode as at least one type of the electrode among the electrodes for supplying the driving voltage to said first charge coupled devices.

It is not necessary to transfer the charge signals in two different directions at the point where the charge signal storages merge to the charge signal transfers. Therefore, the number of metal wires for supplying a driving voltage to the charge coupled devices can be reduced, thereby achieving reduction of the distance between metal wires of the same type can be reduced. By reducing the distance between the metal wires in such a manner, the time delay for the transfer of a driving voltage can be reduced so that the frame rate is increased. In addition, noise can be reduced due to reduction in the number of metal wires. Furthermore, the number of metal layers can be reduced due to the reduction in the number of metal wires. The reduction in the number of metal layers allows reduction in noise so that yield is increased. Moreover, by using at least one type of the electrode as the electrode for supplying driving voltages to both the charge signal storage and the charge signal transfer, the number of mental wires for supplying the driving voltages can be reduced.

It is preferable that the high speed image sensor further comprising: a light blocking layer having a plurality of windows respectively corresponding to individual charge signal converter, each of the window allowing incident beam to be transmitted to said charge signal converter, and the portion of the light blocking layer other than the windows blocking the incident beam; a plurality of charge signal discharge controllers respectively provided to each of the charge signal storages, and discharging charge signals transferred by the corresponding charge signal storage to the outside of the sensor; and a control voltage supplier supplying a control voltage to said plurality of charge signal discharge controller via said light blocking layer.

It is not necessary to control the charge signal discharge controllers at a speed as high as when controlling the charge signal storages. Accordingly, the control voltage can be supplied to the charge signal discharge controllers via the light blocking layer having a large electrical capacitance. By supplying the control voltage to the charge signal discharge controllers via the light blocking layer, it is not necessary to provide metal wires for supplying the control voltage, resulting in that the number of metal wires are reduced. Therefore, by reducing the distance between the metal wires of the same type, the time delay of the transfer of a driving voltage can be reduced so that the frame rate can be increased. Further, noise can be reduced due to the reduction in the number of metal wires. Furthermore, the number of metal layers can be reduced due to the reduction in the number of metal wires. Such a reduction in the number of metal layers allows an increase in yield.

It is preferable that the charge signal storages are formed of charge coupled devices, and the high speed image sensor further comprises: a plurality of metal wires for supplying driving voltages to the charge coupled devices; and a driving voltage supplier for supplying driving voltages of two phases via said metal wires.

Since the charge coupled devices forming the charge signal storages are operated by the driving voltage of two phases the frame rate can be increased. Specifically, comparing with the driving voltage of three or more phases which requires the change in voltage of three to eight steps for transferring the charge signal from one element to the next element, the driving voltage of two phase requires the change in voltage of only two steps for transferring the charge signal from one element to the next element. Therefor, speed of transfer of charges is increased so that the frame rate is increased.

According to the present invention characterized as described above, it becomes possible to capture images at a high frame rate much greater than one million frames per second.

A second aspect of the invention provides an image capturing apparatus provided with the above described high speed image sensor.

BRIEF DESCRIPTION OF THE DRAWINGS

FIGS. 8 are views for describing serial overwriting, wherein

FIGS. 9 are views for describing the read-out operation, wherein

FIGS. 19 are schematic configuration views showing driving electrodes and wires for supplying driving voltage, wherein

BEST MODE FOR CARRYING OUT THE INVENTION

Figure 1:
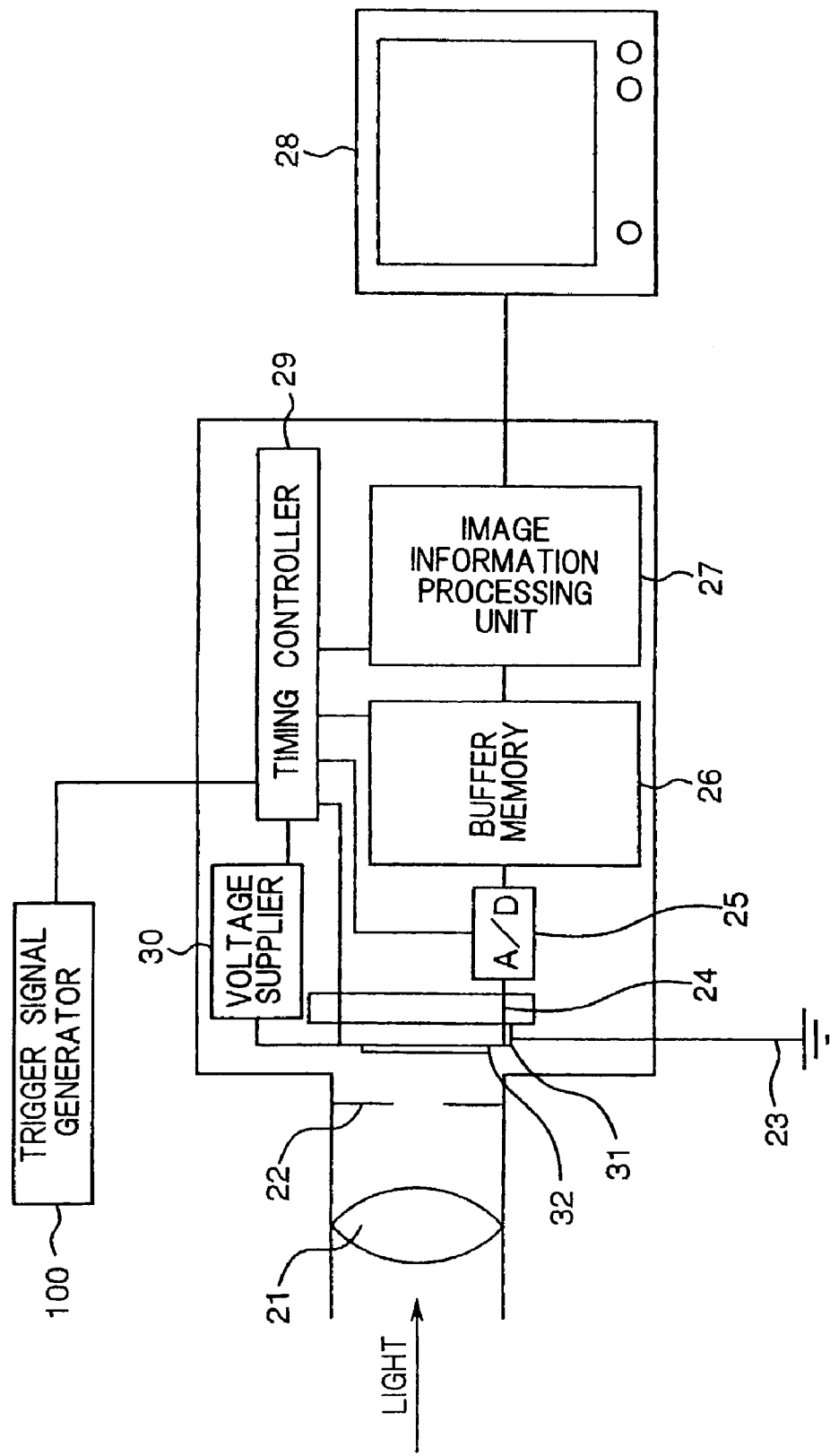
FIG. 1 is a schematic configuration diagram showing a high speed image capturing apparatus provided with a high speed image sensor of the present invention.

Next, embodiments of the present invention shown in the drawings will be described in detail.

FIG. 1 shows the entire configuration of a high speed image capturing apparatus. Light that has entered a lens 21 passes through an external shutter 22 and forms an image on a photo-receptive area 32 of a high speed image sensor 31. Charges are generated according to the intensity of the incident light during image capturing and excessive charges generated by excessive incident light are discharged to ground through a drain line 23. After image capturing, charge signals (image information) that has stored via a read-out line 24 within the image sensor are converted to digital information by AD converter 25 and then stored in a buffer memory 26. The image information stored in the buffer memory 26 is converted to sequential pieces of image information by an image information processing unit 27, and then outputted to the outside of the high speed image capturing apparatus. This image information can be visually observed as images on a monitor 28. Further, the high speed image capturing apparatus is provided with a timing controller 29 for controlling the entire thereof. Furthermore, the high speed image capturing apparatus is provided with a voltage supplier 30 for generating several types of voltages for controlling the high speed image sensor including driving voltages and control voltages described below. A trigger signal generator 100 is connected to timing controller 29. The trigger signal generator 100 monitors a change in brightness of an object and outputs a trigger signal for instructing the halting of serial overwriting when a specific condition is satisfied.

Then, high speed image sensor 31 will be described.

Figure 2:
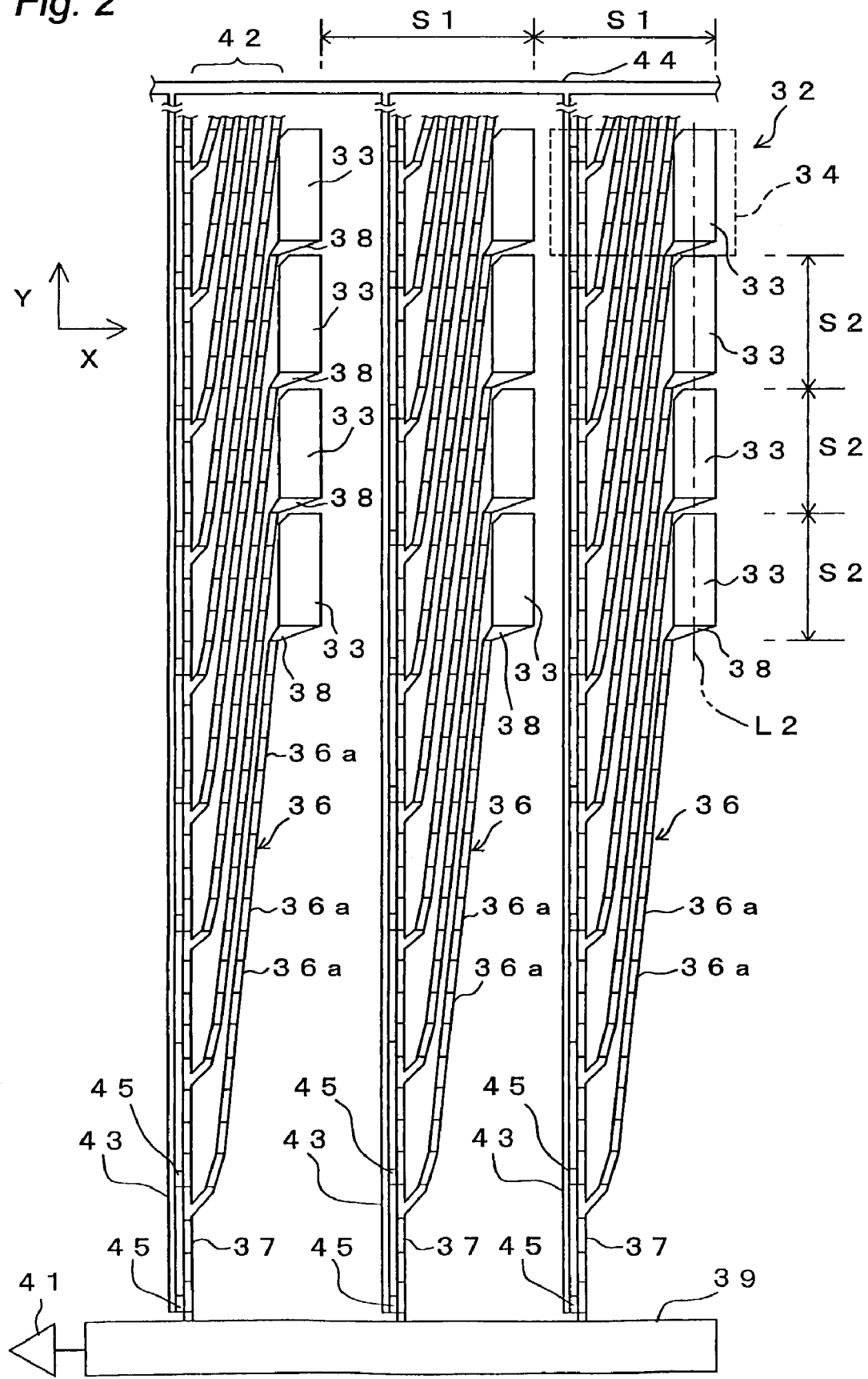
FIG. 2 is a partial front view showing a photo-receptive area of the high speed image sensor.

As shown in FIG. 2, a plurality of photodiodes (charge signal converters) 33 is arranged on photo receptive area 32. These photodiodes 33 are arranged so that intervals S1 in the row direction (X axis direction) and intervals S2 in the columnar direction (Y axis direction) respectively become constant. Further, photodiodes 33 are arranged on photoreceptive area 32 in a right-angled grid pattern (including a square grid pattern). Pixels 34 each of which includes one photodiode 33 are also arranged in a right-angled grid pattern. Illustrated in FIG. 2 are three photodiodes in the row direction and four photodiodes in the columnar direction, making up a total of twelve photodiodes 33.

One linear CCD for recording (charge signal storage) 36 is provided for each of the photodiodes 33. Further, one linear CCD for vertical read-out (charge signal transfer) 37 is provided for each of columns of photodiodes 33.

One end of the CCD 36 for recording is connected to the corresponding photodiode 33 via an input gate 38. Further, the CCD 36 for recording extends in a direction slanted with respect to a line L2 connecting photodiodes 33 adjacent to each other in the columnar direction. Furthermore, the other end of CCD 36 for recording merges to the CCD 37 for vertical read-out. The CCDs 36 of which one ends are connected to a photodiodes 33 in the same column merge at their other ends to the CCD 37 for vertical read-out corresponding to this column. In other words, all CCDs 36 for recording connected to photodiodes 33 in the same column merge to the same CCD 37 for vertical read-out.

The CCD 37 for vertical read-out extends in the columnar direction (vertical direction) of photodiodes 33. Further, the lower end in the figure of the CCD 37 for vertical read-out extends to the outside of the photo-receptive area 32 so as to be connected to a CCD 39 for horizontal read-out. The CCD 39 for horizontal read-out is connected to a signal read-out line 24 (see FIG. 1) via an amplifier 41.

Figure 3:
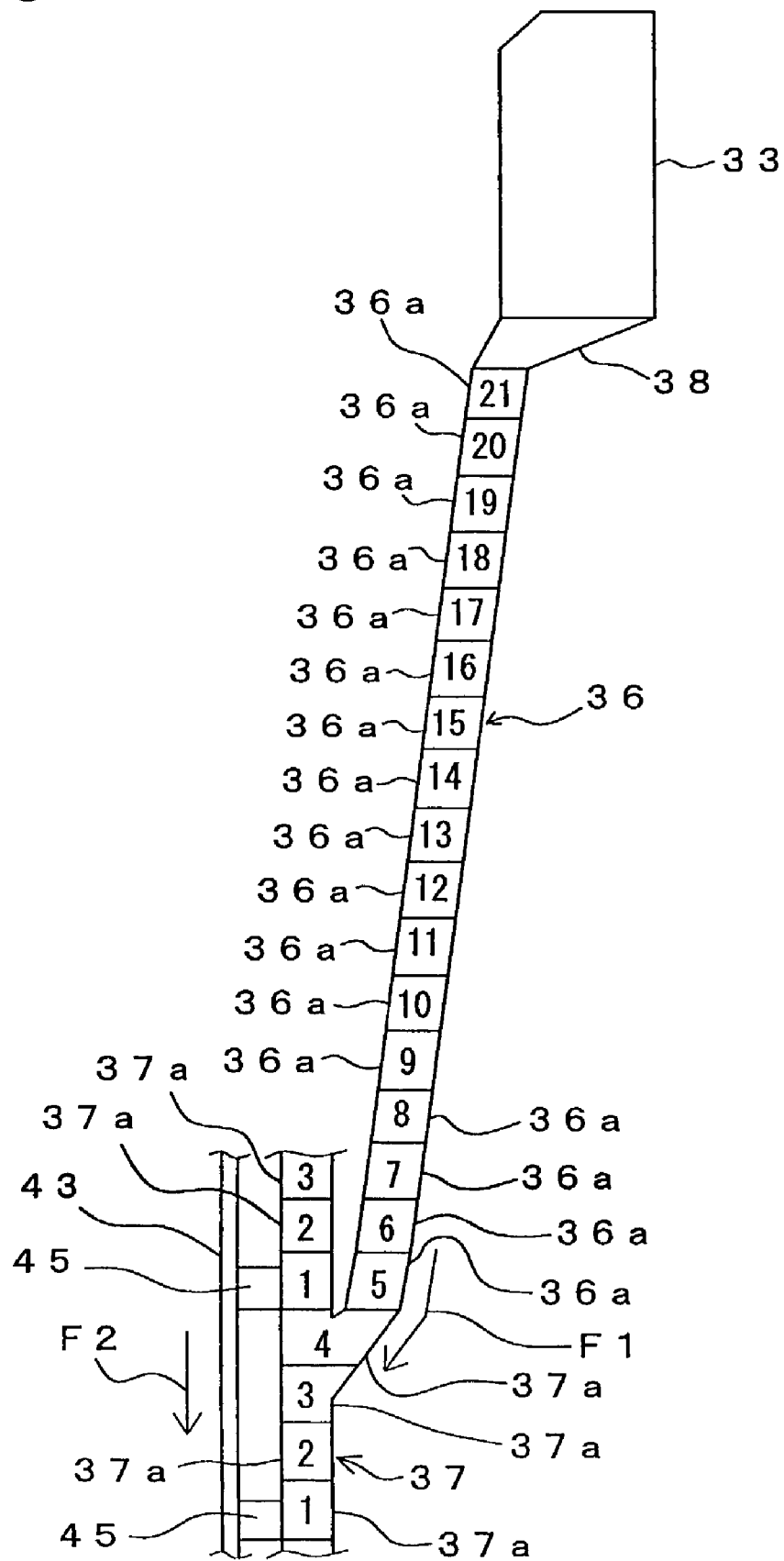
FIG. 3 is a partial enlarged view showing a photodiode, a CCD for recording and a CCD for vertical read-out.

In FIG. 3, as the numbers 5 to 16 indicate,

As indicated by numerals 5 to 21 in FIG. 3, the CCD 36 for recording includes seventeen elements 36a and merges to the CCD 37 for vertical read-out at the place located after eighteenth element 36a counting from the input gate 38. In FIG. 3, a numeral "4" is attached to an element 37a of the CCD 37 for vertical read-out located at a portion to which the CCD 37 merges. As shown by arrows F1 and F2 in FIG. 3, at the point wherein the CCD 36 for recording merges to the CCD 37 for vertical read-out, namely in the vicinity of element 37a to which the numeral "4" is attached, the direction of transfer of the charge signals in the CCD 36 for recording and the direction of transfer of the charge signals in the CCD 37 for vertical read-out are substantially the same directions.

As shown in FIG. 2, each pixel 34 includes four elements 36a in the row direction and four elements 36a in the columnar direction, therefor making up a total of sixteen elements 36a of the CCD 36 for recording. The CCDs 36 for recording, which extend in the direction to the lower left in the figure from the photodiodes 33, form a memory region 42 narrowly extends in the columnar direction. On the left side of the memory region 42 in the figure, the CCD 37 for vertical read-out is provided.

On the left side of the CCD 37 for vertical read-out in the figure, a drain 43 extending parallel to the CCD 37 for vertical read-out is provided. A drain 43 is provided for each of the columns of the photodiodes 33 in the same manner as the CCDs 37 for vertical read-out. The drains 43 extend outside of the photo-receptive area 32 and are connected to a drain line 44 extending in the horizontal direction. The drain line 44 is connected to the above-mentioned drain line 23 (see FIG. 1) connected to the ground.

As shown in FIG. 3, the drain 43 is connected to the element 37a located upstream side of the transfer direction of the charge signals shown by the arrow F2 with respect to the element 37a to which the number "4" is attached by one elements. Namely, the drain 43 is connected to the elements 37a to which the numeral "1" is attached. A drain gate 45 is provided between the drain 43 and the element 37a of CCD 37 for vertical read-out.

Figure 4:
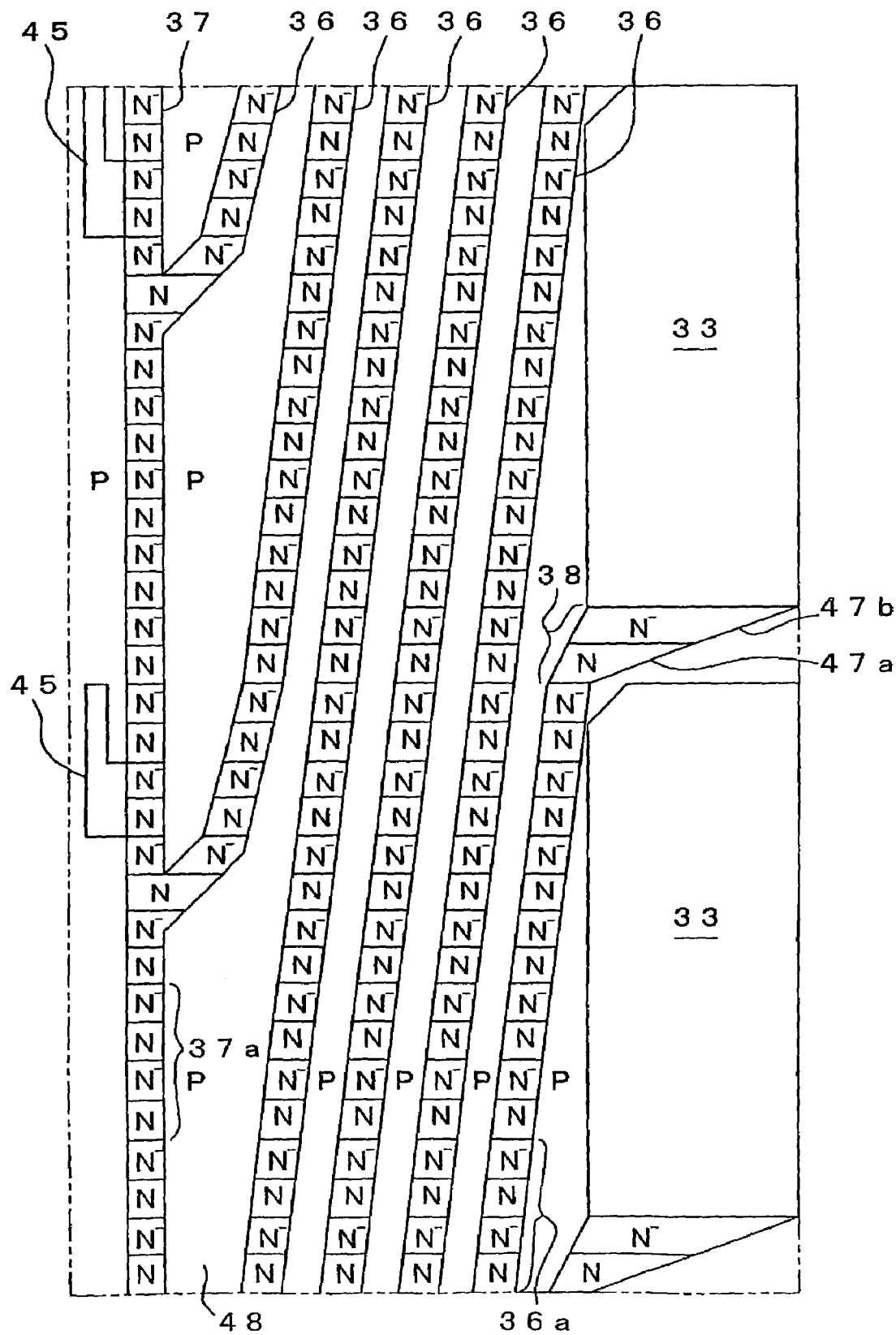
FIG. 4 is a partial enlarged front view showing a substrate (lowest layer)
Figure 5:
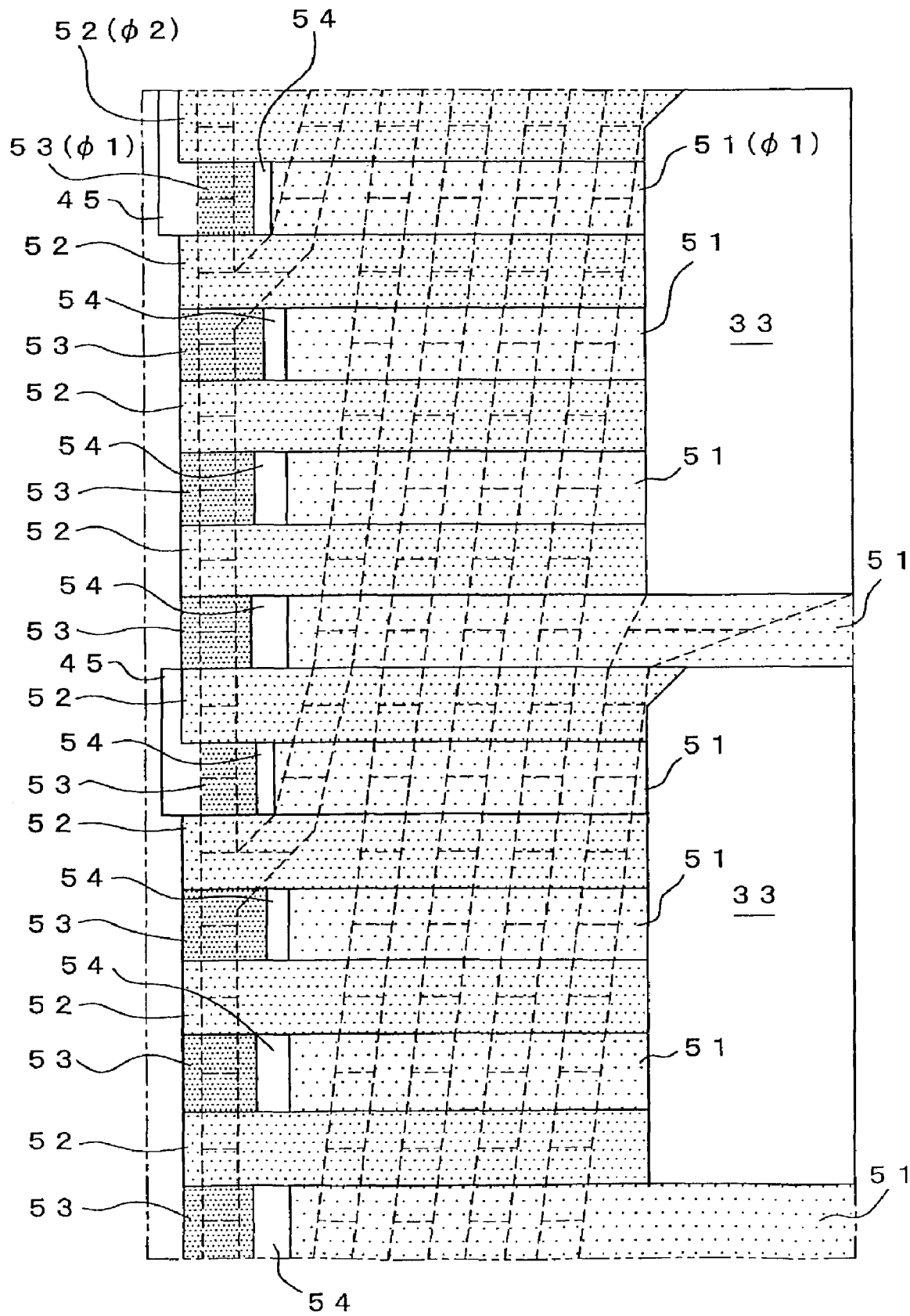
FIG. 5 is a partial enlarged front view showing a poly-silicon layer.
Figure 6:
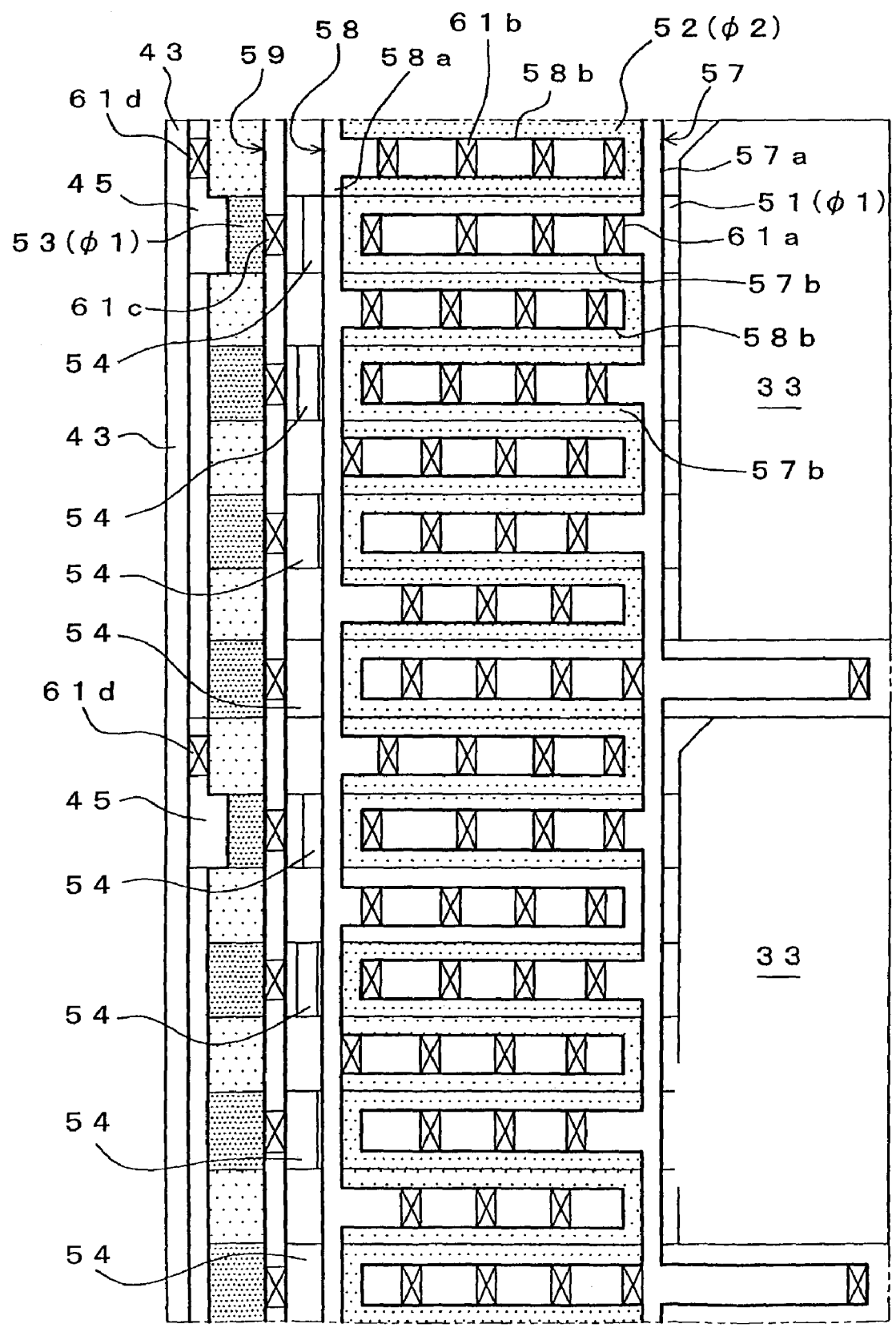
FIG. 6 is a partial enlarged front view showing a metal layer.
Figure 7:
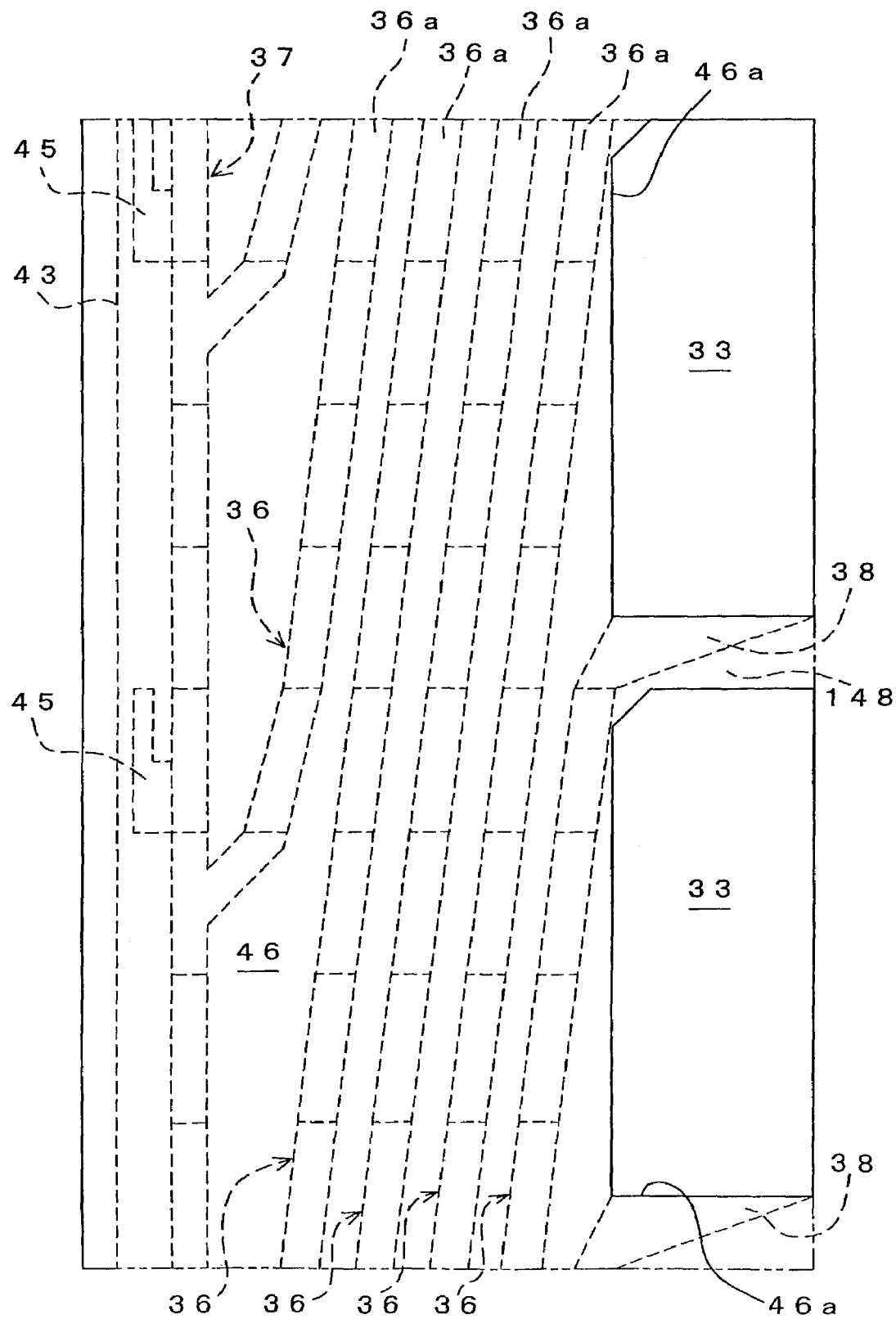
FIG. 7 is a partial enlarged front view showing a light blocking layer (top layer)

Next, the structure of photo-receptive area 32 will be described in detail with reference to FIGS. 4 to 7. Of these figures, FIG. 4 shows the substrate (lowest layer). FIG. 5 shows a polysilicon electrode layer formed on the lowest layer. FIG. 6 shows a metal layer formed on top of the polysilicon electrode layer. FIG. 7 shows a light blocking layer 46, which is the top layer. Transparent insulating layers (not shown) are respectively provided between the substrate and the polysilicon electrode layer, between the polysilicon electrode layer and the metal layer, and between the metal layer and light blocking layer 46.

As shown in FIGS. 2 and 4, the substrate is provided with the photodiodes 33, CCDs 36 for recording, input gates 38, drain gates 45 and CCDs 37 for vertical read-out. The CCDs 36 for recording are formed by providing N regions 47a and N− regions 47b in an alternating manner. Four sequential N regions 47a and N− regions 47b form one element 36a. The CCD 37s for vertical read-out are also formed by providing N regions 47a and N− regions 47b in an alternating manner, and four sequential N regions 47a and N− regions 47b form one element 37a. Further, one pair of an N region 47a and an N− region 47b forms one input gate 38. The remaining portion of the substrate other than the photodiodes 33, CCDs 36 for recording, input gates 38, drain gates 45, and CCDs 37 for vertical read-out forms a channel stop 48 of a P region.

As shown in FIG. 5, three types of polysilicon electrodes 51, 52 and 53 are provided in the polysilicon layer.

Of these electrodes, the first polysilicon electrodes 51 are for driving CCDs 36 for recording, and a driving voltage of phase φ1 is applied thereto. Further, the second polysilicon electrodes 52 are used for driving both the CCDs 36 for recording and the CCDs 37 for vertical read-out, and a driving voltage of phase φ2 is applied thereto. Furthermore, the third polysilicon electrodes 53 are electrodes for driving the CCDs 37 for vertical read-out, and a driving voltage of phase φ1 is applied thereto.

These polysilicon electrodes 51 to 53 extend in the row direction (horizontal direction) of photodiodes 33 in photo-receptive area 32. Below each of the polysilicon electrodes 51 to 53, one pair of the N region 47a and the N− region 47b are located. The first polysilicon electrode and the third polysilicon electrode 53 are provided arranged in line in the row direction (horizontal direction). However, a gap 54 is provided between the first polysilicon electrode 51 and the third polysilicon electrode 53, so that the first polysilicon electrode 51 and the third polysilicon electrode 53 are electrically isolated from each other by the gaps 54. The first and third polysilicon electrodes 51 and 53 and the second polysilicon electrodes 52 are provided, in an alternating manner in the columnar direction. Each pair of the first polysilicon electrode 51 and the second polysilicon electrode 52 corresponds to one element 36a of the CCD 36 for recording, while each pair of the second polysilicon electrode 52 and the third polysilicon electrode 53 corresponds to one element 37a of the CCD 37 for vertical read-out.

As shown in FIG. 6, the metal layer includes first metal wires 57, second metal wires 58, third metal wires 59, and drains 43. The metal wires 57 to 59 supply driving voltages outputted by the above described voltage supplier 30 to polysilicon electrodes 51 to 53. Of the metal wires 57 to 59, the first metal wire 57 provides a driving voltage of phase φ1 to first polysilicon electrodes 51. Further, the second metal wire 58 supplies a driving voltage of phase φ2 to the second polysilicon electrodes 52. Furthermore, third metal wire 59 supplies a driving voltage of phase φ1 to third polysilicon electrodes 53.

The first metal wire 57 is formed of one main line 57a extending in the columnar direction (vertical direction) and a plurality of branch lines 57b that branch from the main line 57a to extend in the row direction (horizontal direction). Each of the branch lines 57b of the first metal wire 57 is connected to the first polysilicon electrode 51 via contact points 61a. Accordingly, the driving voltage of phase φ1 is supplied to the elements 36a of the CCD 36 for recording via the first metal wire 57 and contact point 61a from the voltage supplier 30.

The second metal wire 58 is also formed of one main line 58a extending in the columnar direction and a plurality of second branch lines 58b that branch from the main line 58a to extend in the columnar direction. Each second branch line 58b is connected to the second polysilicon electrode 52 via contact points 61b. Accordingly, the driving voltage of phase φ2 is supplied to the elements 36a of the CCD 36 for recording and the elements 37a of the CCD 37 for vertical read-out via the second metal wire 58 and contact points 61b from the voltage supplier 30.

The third metal wire 59 extends in the columnar direction in the same manner as the above described first metal wire 57 and second metal wire 58, and is connected to a third polysilicon electrodes 53 via contact points 61c. Accordingly, a driving voltage of phase φ1 is supplied to an element 37a of a CCD 37 for vertical read-out via third metal wire 59 and contact point 61c from voltage supplier 30.

The drain gates 45 are connected to light blocking layer 46 via contact points 61d. Accordingly, a control voltage for opening or closing the drain gates 45 is supplied to drain gates 45 via light blocking layer 46 and contact points 61d. The drain gates 45 need not be controlled at high speed as the CCDs 36 for recording and the CCDs 37 for vertical read-out. Therefore, it is possible to supply a control voltage via light blocking layer 46 having a comparatively large electrical capacitance.

As shown in FIG. 7, a plurality of windows 46a are provided in light blocking layer 46 so as that each of them corresponds to the photodiode 33. These windows 46a allow light to enter photodiodes 33. The remaining portion of the light blocking layer 46 other than windows 46a covers photo-receptive area 32 so as to block incident light. The light blocking layer 46 is made of a conductive metal. The conductive metal includes metal such as Aluminum.

Figure 13:
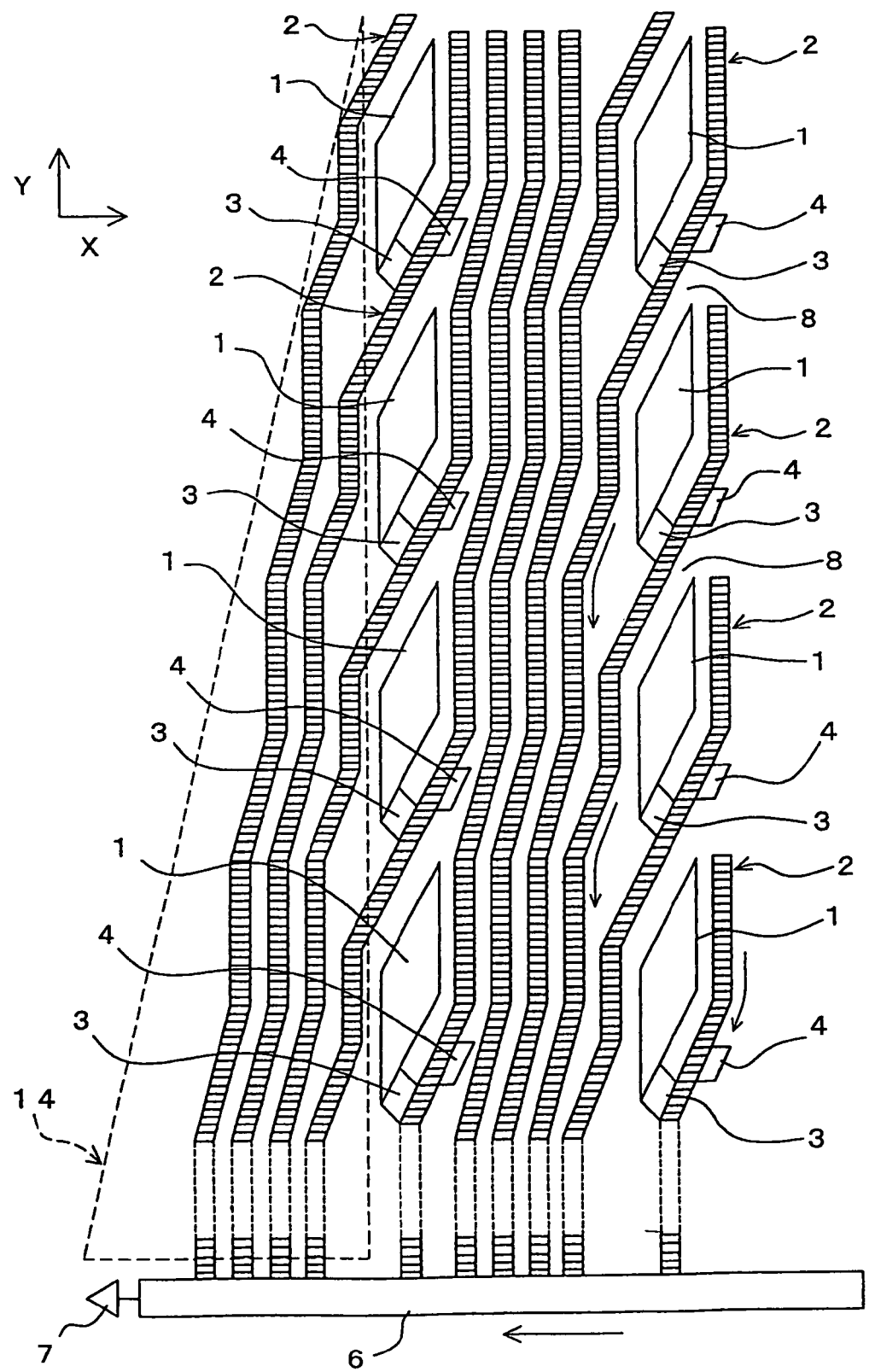
FIG. 13 is a schematic view showing the structure of the slanted CCD-type image sensor according to the conventional art.
Figure 14A:
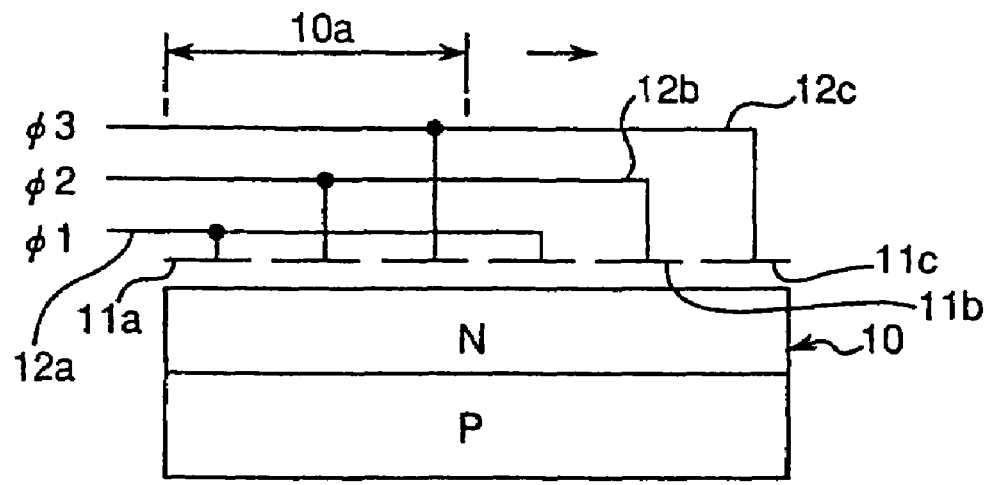
FIG. 14A is a schematic view showing a CCD charge transfer path driven according to a driving voltage having three levels and three phases.
Figure 14B:
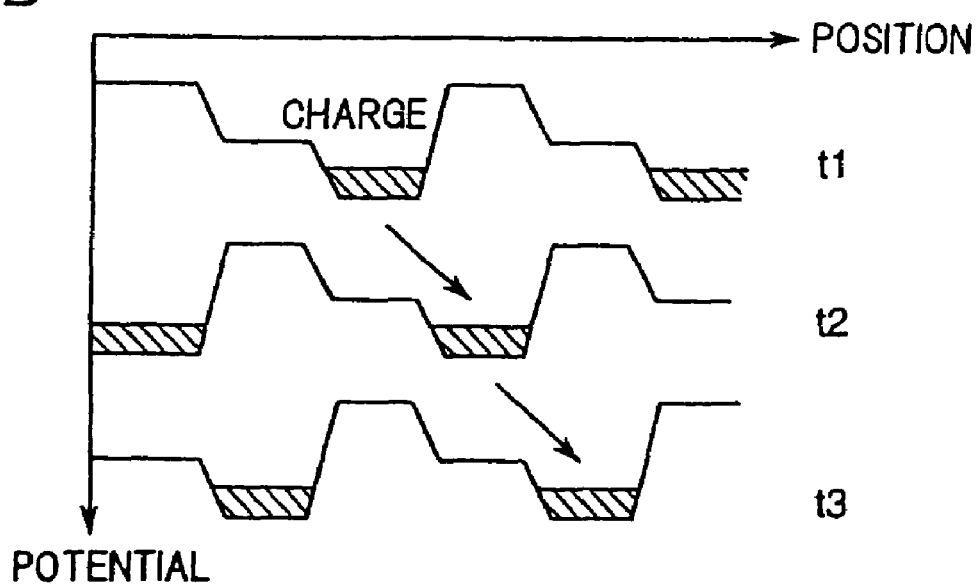
FIG. 14B is graph showing the relationship between position and potential.
Figure 14C:
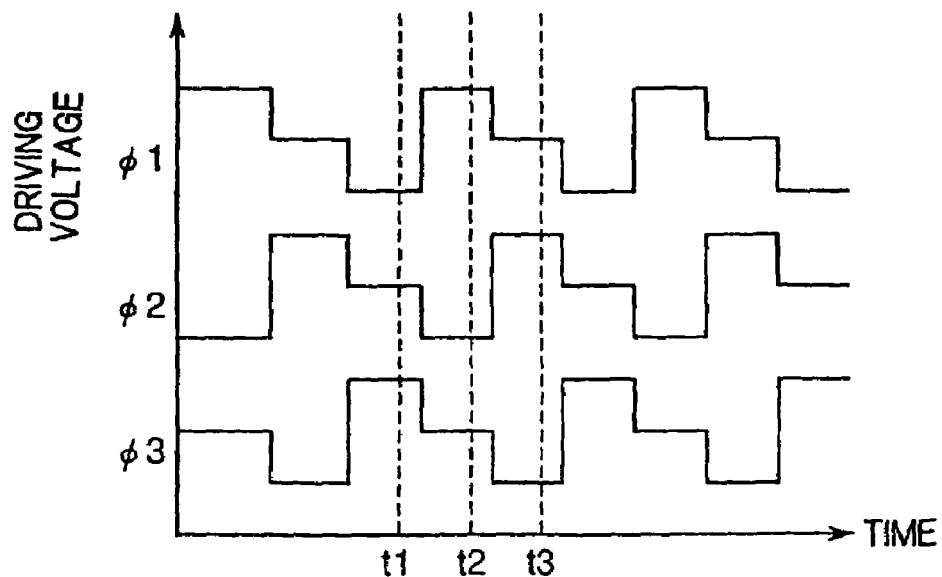
FIG. 14C is a waveform chart of the driving voltage.
Figure 15A:
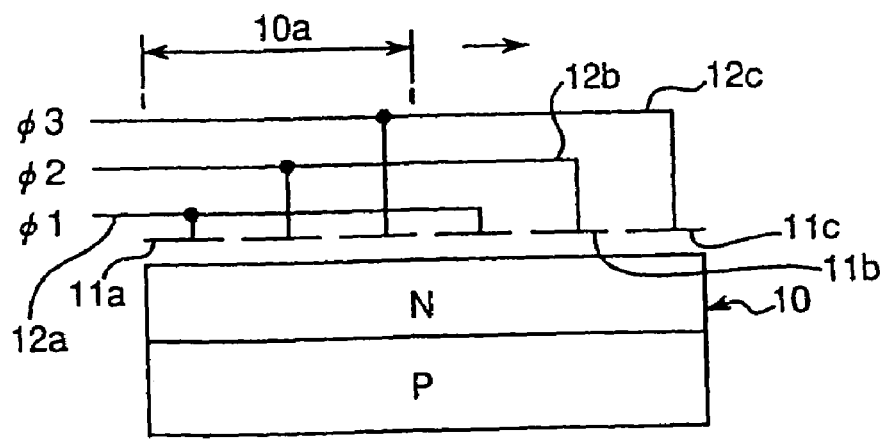
FIG. 15A is a schematic view showing a CCD charge transfer path driven according to a driving voltage having two levels and three phases.
Figure 15B:
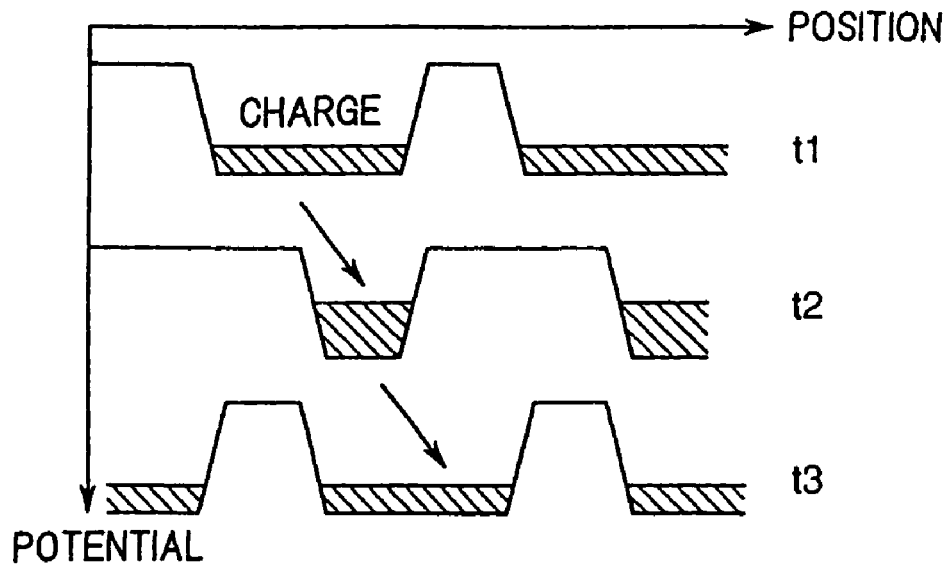
FIG. 15B is a graph showing the relationship between position and potential.
Figure 15C:
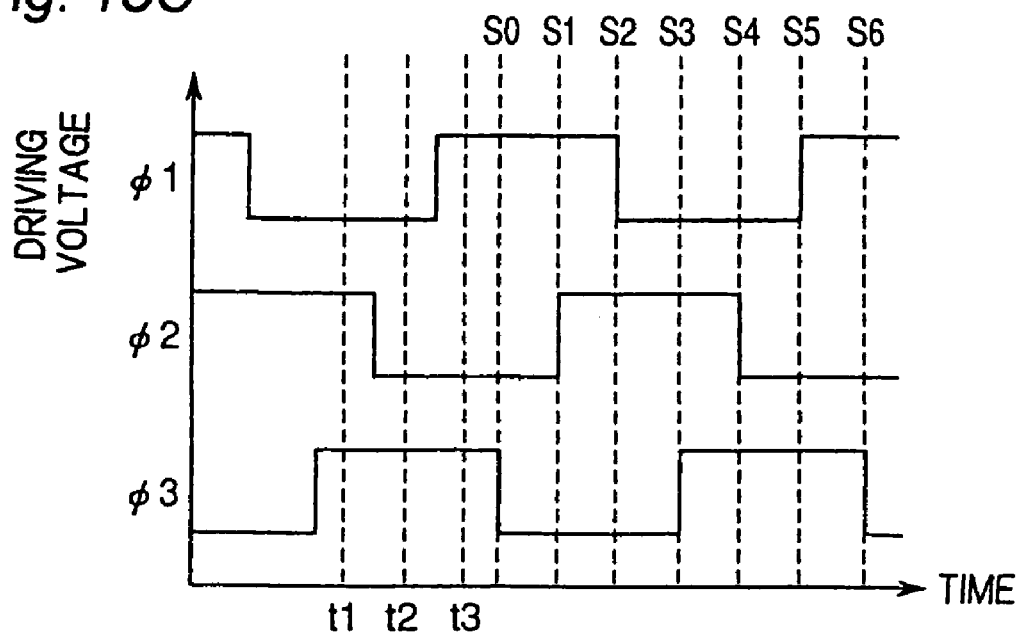
FIG. 15C is a waveform chart of the driving voltage.
Figure 16A:
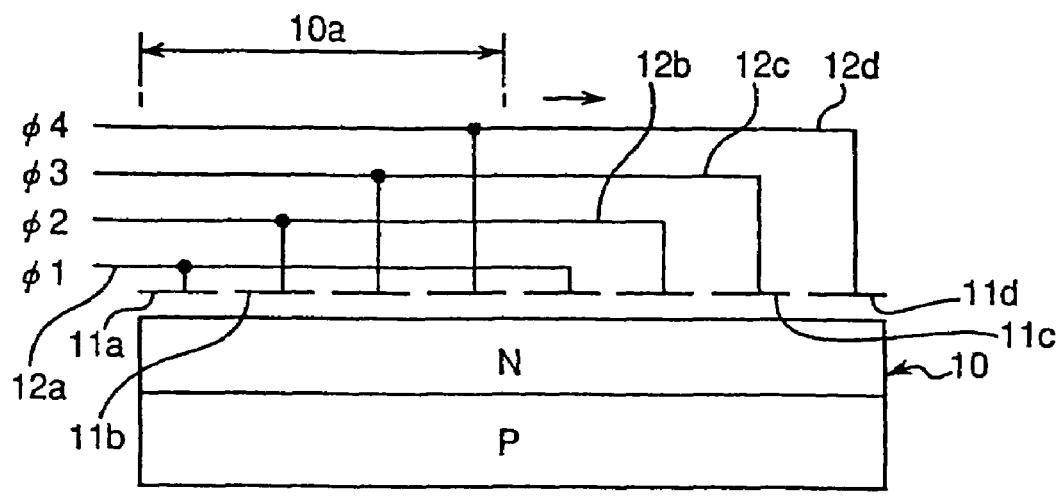
FIG. 16A is a schematic view showing a CCD charge transfer path driven according to a driving voltage having two levels and four phases.
Figure 16B:
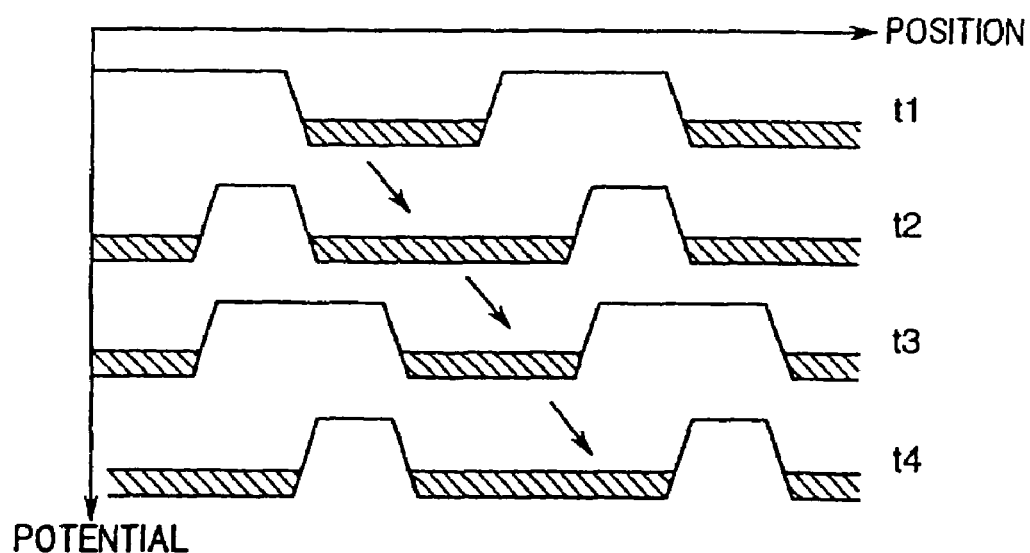
FIG. 16B is a graph showing the relationship between position and potential.
Figure 16C:
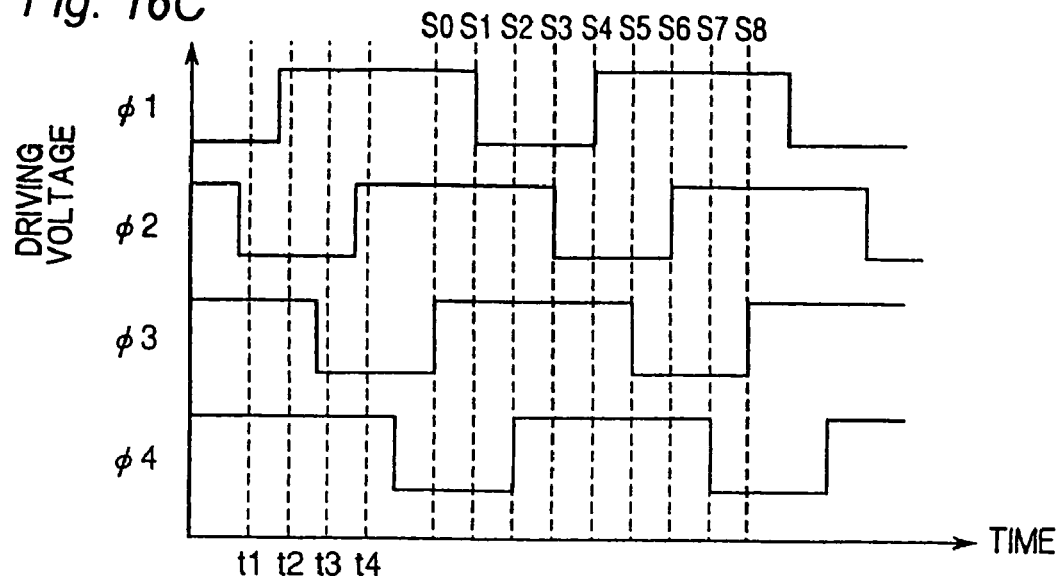
FIG. 16C is a waveform chart of the driving voltage.
Figure 17A:
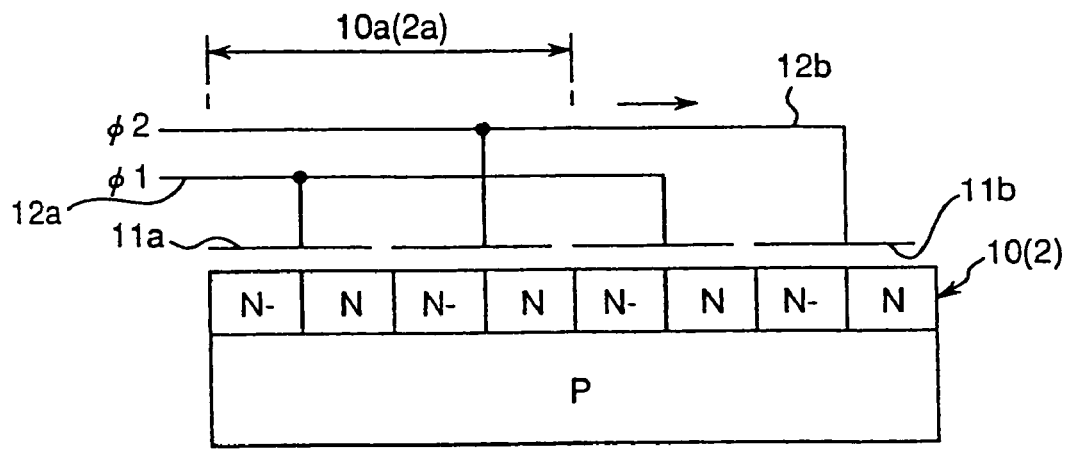
FIG. 17A is a schematic view showing a CCD charge transfer path driven according to a driving voltage having two levels and two phases.
Figure 17B:
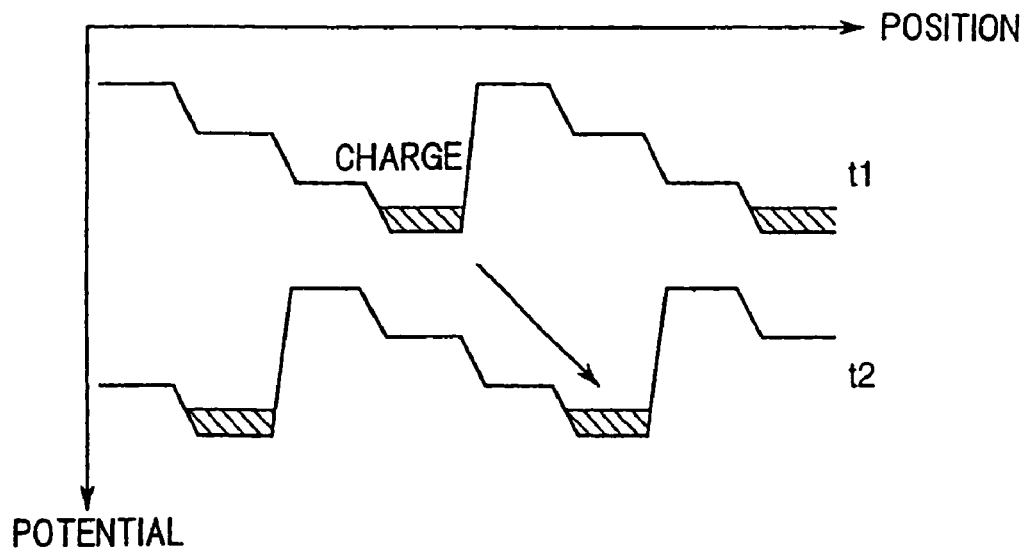
FIG. 17B is a graph showing the relationship between position and potential.
Figure 17C:
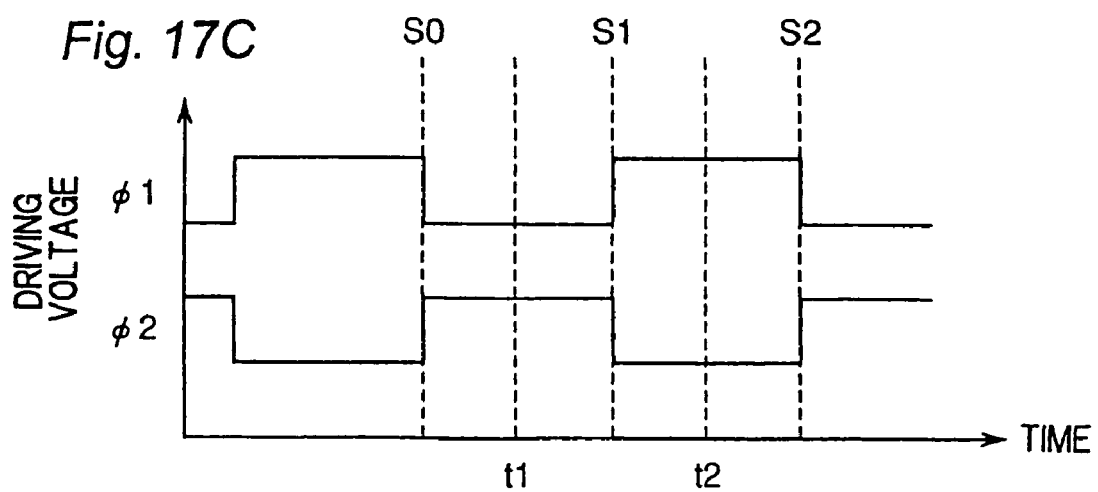
FIG. 17C is a waveform chart of the driving voltage.
Figure 18A:
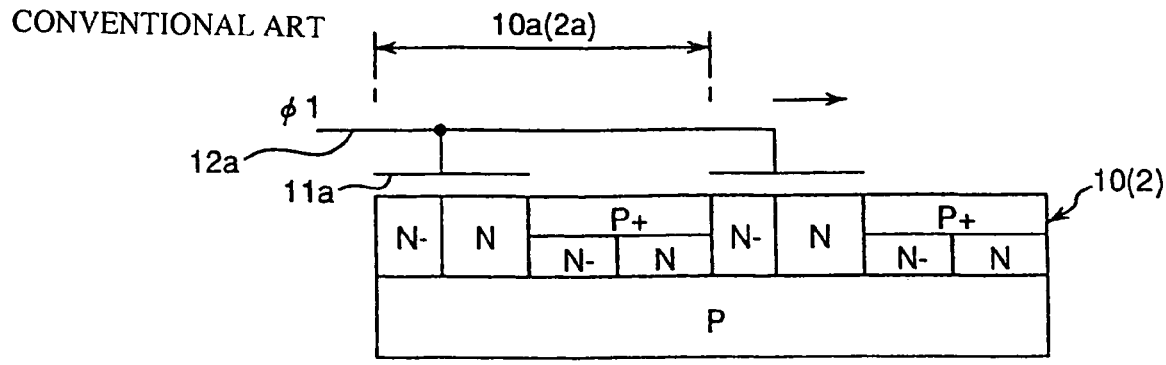
FIG. 18A is a schematic view showing a CCD charge transfer path driven according to a driving voltage having two levels and one phase.
Figure 18B:
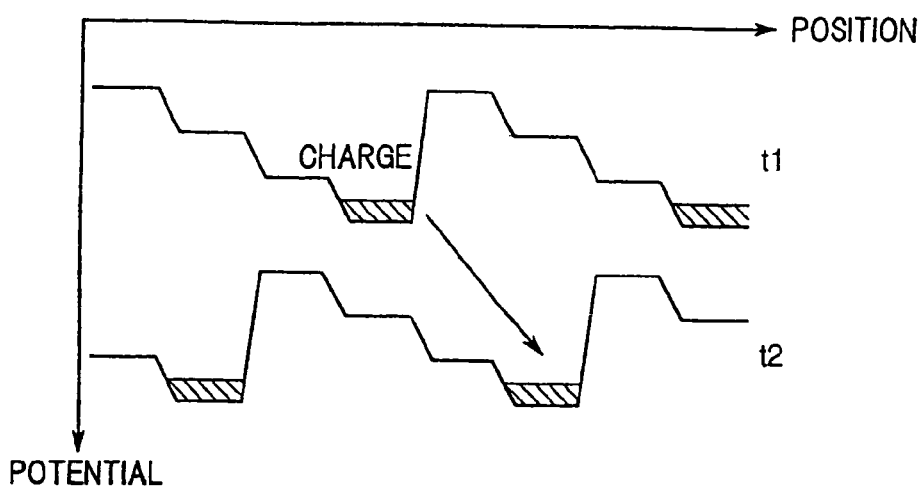
FIG. 18B is a graph showing the relationship between position and potential.
Figure 18C:
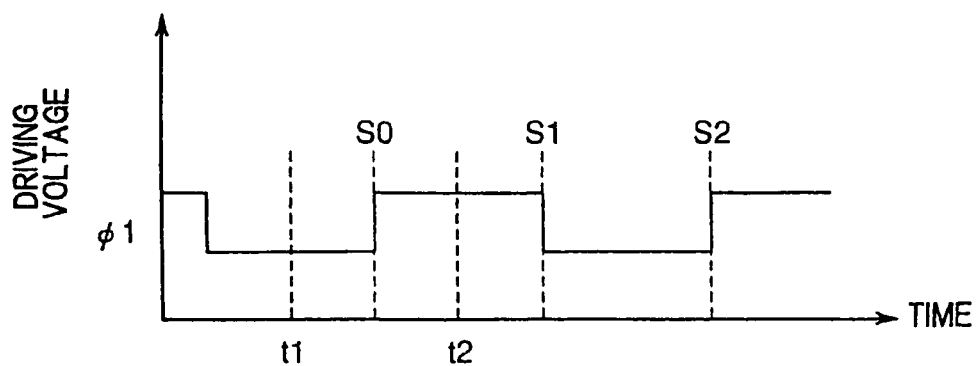
FIG. 18C is a waveform chart of the driving voltage.
Figure 19A:
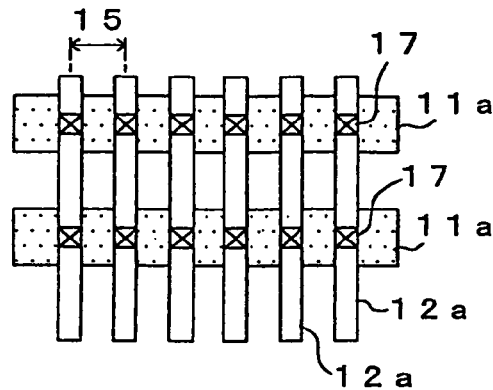
FIG. 19A shows a case of one phase.
Figure 19B:
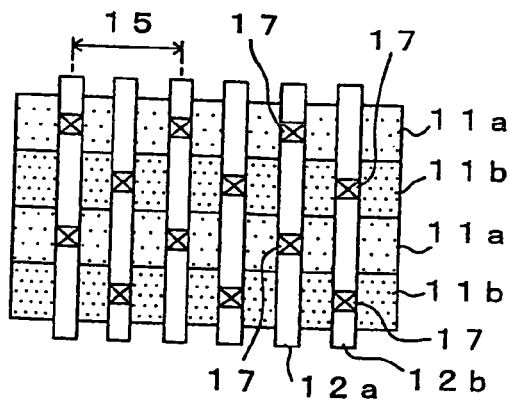
FIG. 19B shows a case of two phases.
Figure 19C:
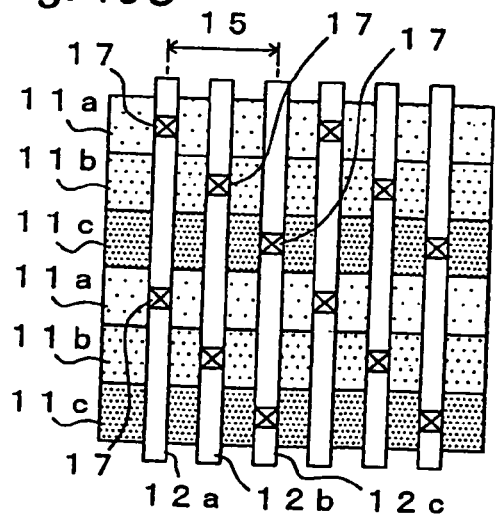
FIGS. 19C, 19D and 19E show cases of three phases.
Figure 19D:
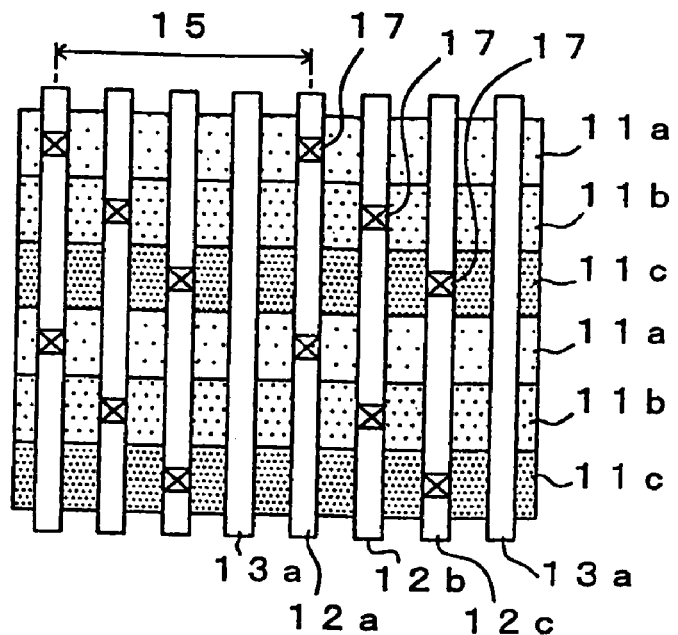
Figure 19E:
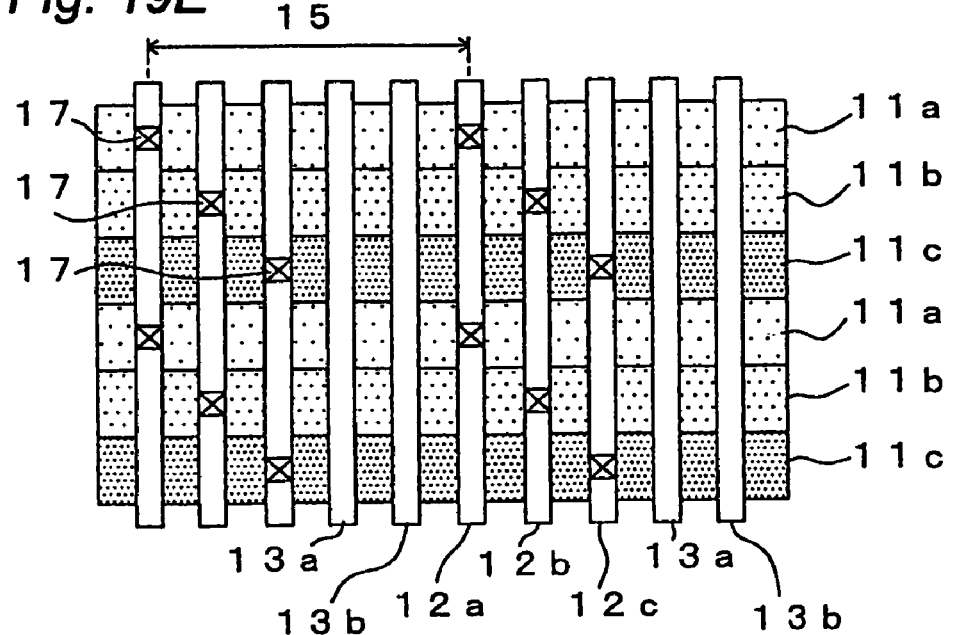

As described above, in the high speed image sensor 31 of the present embodiment, the charge signals stored in the CCDs for recording are read-out by the vertical CCDs 37 for read-out respectively provided for each column of photodiodes 33 and extending in the column direction. Accordingly, photo-receptive area 32 is in a rectangular shape, which does not have a triangular region 14 (see FIG. 13), wherein CCDs 36 for recording exist but no photodiodes 33 exist. Thereby, miniaturization of the sensor can be achieved. Further, in the case that the same area is provided for the photo-receptive area, the number of photodiodes increases because of the absence of a triangular region, resulting in enhancement resolution.

Next, the operation of a high speed image sensor 31 will be described.

First, serial overwriting image capture will be described.

A control voltage is applied to a drain gate 45 via light blocking layer 46 and a contact point 61d from voltage supplier 30 so that drain gate 45 maintains the same potential as drain line 43. In this condition, a charge signal is discharged to the outside of the sensor from the element 37a of the vertical CCD for read-out 37 connected toe the drain gate 45, i.e., the element 37a to which the numeral "1" is attached in FIG. 3 through the drain gate 45, drain lines 43 and 23.

Figure 8A:
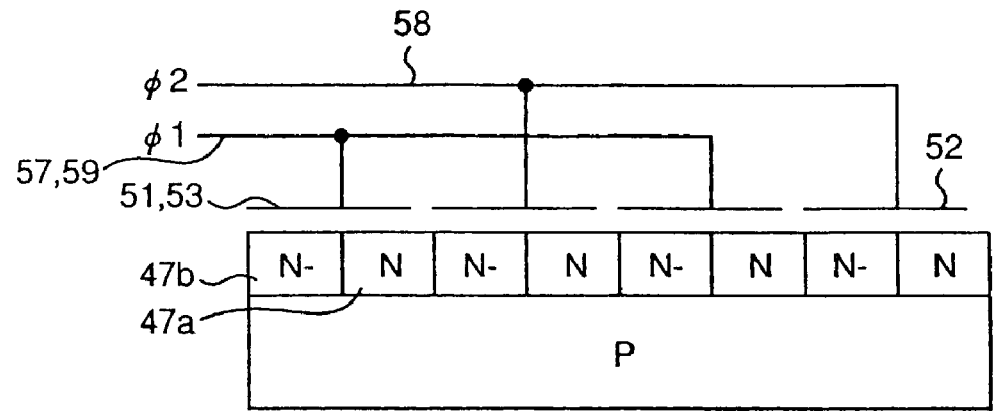
FIG. 8A is a schematic view showing a CCD charge transfer path.
Figure 8B:
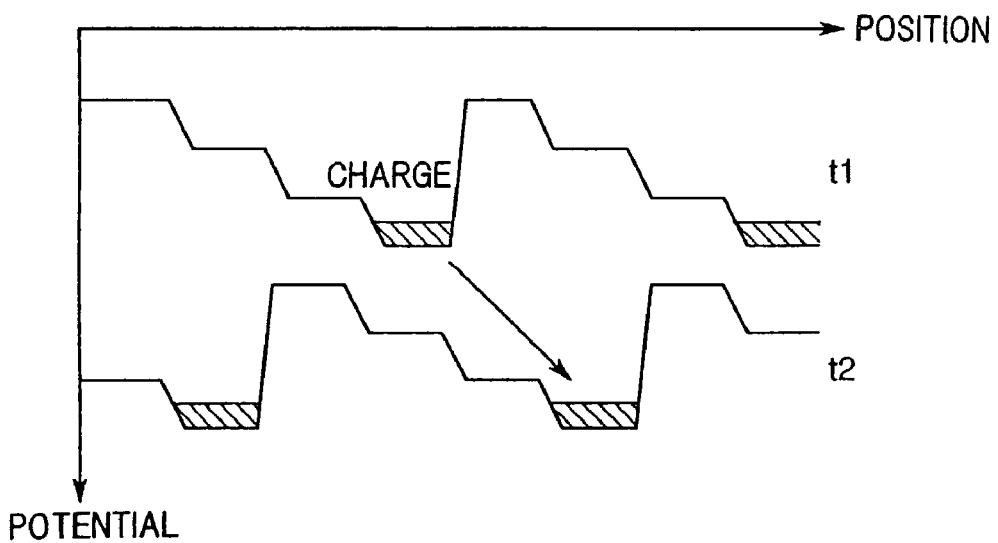
FIG. 8B is a graph showing the relationship between position and potential.
Figure 8C:
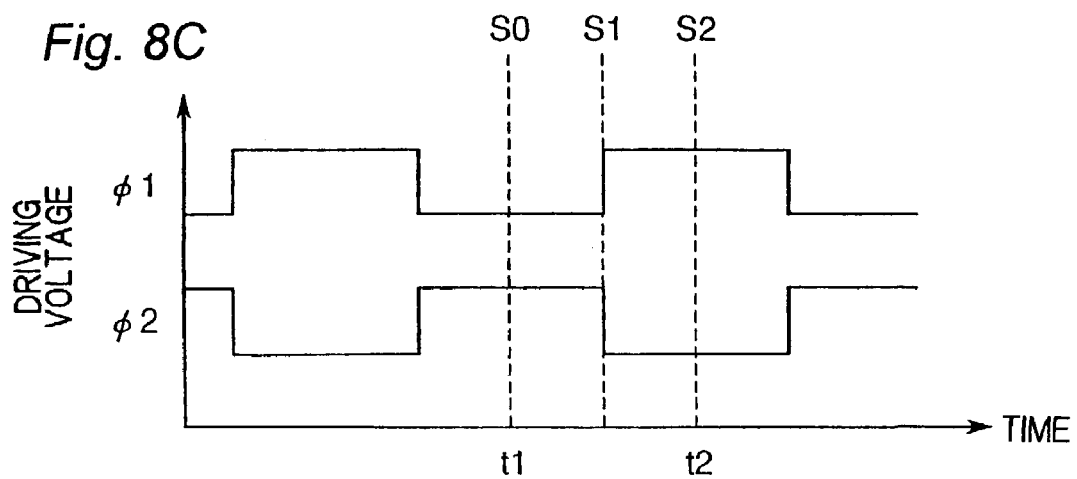
FIG. 8C is a waveform chart of driving voltages.

Further, at the serial overwriting image capture, as shown in FIG. 8C, the driving voltage having two levels and two phases is applied to a CCD 36 for recording and to a CCD 37 for vertical read-out from voltage supplier 30. Specifically, the driving voltage of phase $\phi 1$ is supplied from the voltage supplier 30 to the elements 36a of the CCDs 36 for recording via the first metal wires 57, contact points 61a, and first polysilicon electrode 51. Further, the driving voltage of phase $\phi 2$ is applied from the voltage supplier 30 to the elements 36a of the CCDs 36 for recording via the first metal wires 58, contact points 61b, and second polysilicon electrodes 52. On the other hand, the driving voltage of phase $\phi 1$ is applied to the elements 37a of the CCDs 37 for vertical read-out via the third metal wires 59, contact points 61c and the third polysilicon electrodes 53. Further, the driving voltage of phase $\phi 2$ is supplied from the voltage supplier 30 to the elements 37a of the CCDs 37 for vertical read-out via the second metal wires 58 and the contact point 61b.

By application of the driving voltages to the CCDs 36 for recording and CCDs 37 for vertical read-out, the charge signals are transferred as shown in FIG. 8B. Specifically, as shown by numbers "5" to "21" attached to elements 36a and by arrow F1 in FIG. 3, the charge signals generated in the photodiodes 33 are transferred from the CCDs 36 for recording toward the point where they merge to the CCDs 37 for vertical read-out merges. Further, as shown by numerals "1" to "4" attached to elements 37a and by arrow F2 in FIG. 3, charge signals that have been transferred to the CCDs 37 for vertical read-out are transferred in the columnar direction (vertical direction). The charge signals transferred by the CCDs 37 for vertical read-out are discharged to the drains 43 through the drain gates 45 from the elements 37a, to which the numeral "1" is attached, before they reaches the merging point on the downstream side, i.e., the elements 37a, to which the numeral "4" is attached in FIG. 3.

According to the above described operation, as shown by numbers "1" to "21" in FIG. 3, a large number of the most recent charge signals are recorded in the elements 36a and 37a of the CCDs 36 for recording and CCDs 37 for vertical read-out while being updated. In addition, since the charge signals are discharged from the drain gates 45, the charge signals generated in one photodiode 33 are not mixed up with the charge signals generated in another photodiode 33 adjacent to said one photodiode in the columnar direction.

When a trigger signal is inputted to the timing controller 29 from the trigger signal generator 100, the serial overwriting image capture is completed as a result of the halting of the application of the driving voltages, and the external shutter 22 is closed.

Then, read-out of the charge signals after the halting of serial overwriting image capture will be described.

A control voltage (for example 0V) for closing the drain gates 45 is applied to the drain gates 45 via the light blocking layer 46. In addition, read-out of the charge signals is carried out by repeating fist process for transferring the charge signals from the CCDs 37 for vertical read-out to the CCD 39 for horizontal read-out and second process for transferring charge signals from the CCDs 36 for recording to the CCD 37 for vertical read-out.

Figure 9A:
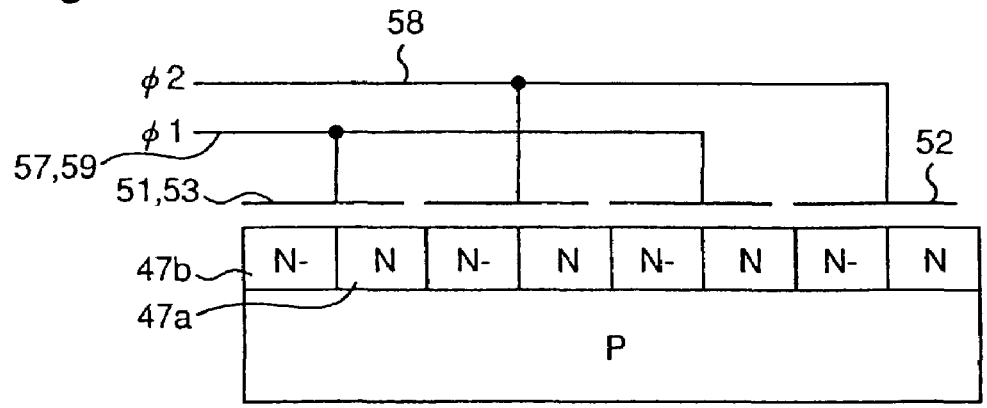
FIG. 9A is a schematic view showing a CCD charge transfer path.
Figure 9B:
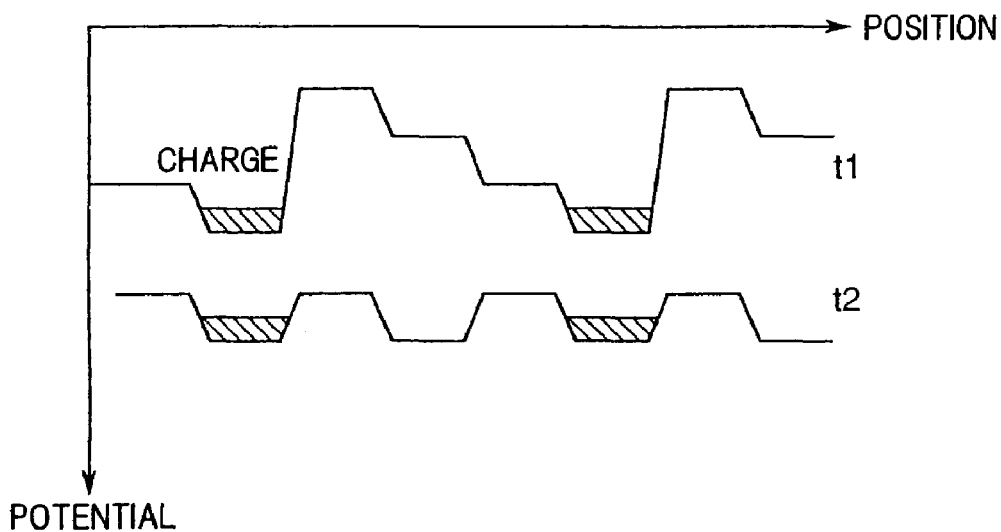
FIG. 9B is a graph showing the relationship between position and potential.
Figure 9C:
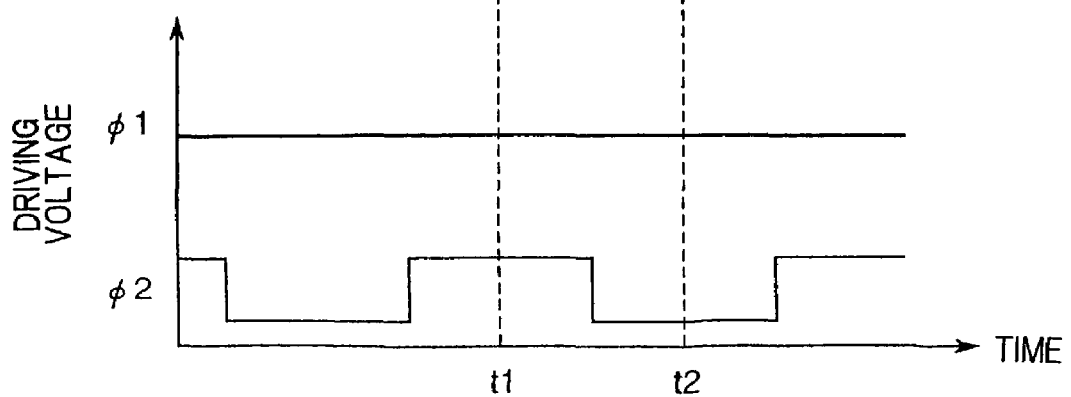
FIG. 9C is a waveform chart of driving voltages.

In the first process, transfer of the charge signals is not carried out in the CCDs 36 for recording, whereas transfer of the signals is carried out in the CCDs 37 for vertical read-out. Specifically, a voltage supplied to the first metal wires 57 for applying the driving voltage of phase f1 to the CCDs 36 for recording is kept constant. On the other hand, a driving voltage having two levels is applied only to the second metal wires 58 for supplying the driving voltage of phase f2 to the CCDs 36 for recording and the CCDs 37 for vertical read-out, as well as to the third metal wires 59 for supplying the driving voltage of phase f1 to the CCDs 37 for vertical read-out. As a result, as shown in FIGS. 9B and 9C, the charge signals stored in the CCDs 36 for recording are not transferred and stay in elements 36a. On the other hand, as shown in FIGS. 8B and 8C and by the arrow F2 in FIG. 3, the charge signals stored in the CCDs 37 for vertical read-out are transferred in the column direction (vertical direction). The charge signals that have been transferred to the CCD 39 for horizontal read-out are transferred to the buffer memory 26 via the amplifier 41, read-out line 24, and A/D converter 25. When all of the charge signals that have stored in the elements 37a of the CCDs 37 for vertical read-out are transferred to the CCD 39 for horizontal read-out, one cycle of the first process is completed and the second process is carried out.

In the second process, transfer of the charge signals is carried out in both the CCDs 36 for recording and CCDs 37 for vertical read-out. Specifically, a driving voltage having two levels is applied to all of the first metal wires 57 for supplying the driving voltage of phase $\phi 1$ to the CCDs 36 for recording, the second metal wires 58 for supplying the driving voltage of phase $\phi 2$ to the CCDs 36 for recording and CCDs 37 for vertical read-out, and the third metal wires 59 for supplying the driving voltage of phase $\phi 1$ to the CCDs 37 for vertical read-out. As a result, charge signals are transferred in both the CCDs 36 for recording and CCDs 37 for vertical read-out as shown by the arrows F1 and F2 in FIGS. 8B, 8C and 3. Accordingly, the charge signals are supplied from the CCDs 36 for recording to the elements 37a of the CCDs 37 for vertical read-out to which numerals "1" to "4" are attached in FIG. 3. When the charge signals are stored in all of the elements 37a of the CCDs 37 for vertical read-out, that is to say, the charge signals are stored in the elements 37a to which numbers "1" to "4" are attached in FIG. 3, one cycle of second process is completed and the first process is again carried out. When all of the charge signals stored in the CCDs 36 for recording, CCDs 37 for vertical read-out, and CCDs 39 for horizontal read-out are transferred to the outside of the sensor due to repetition of the fist and second processes, read-out of the signals is completed.

The high speed image sensor 32 of the present embodiment allows the achievement of an enhancement in the frame rate, a reduction in noise, and an increase in yield.

The enhancement in the frame rate will be described below.

Figure 10C:
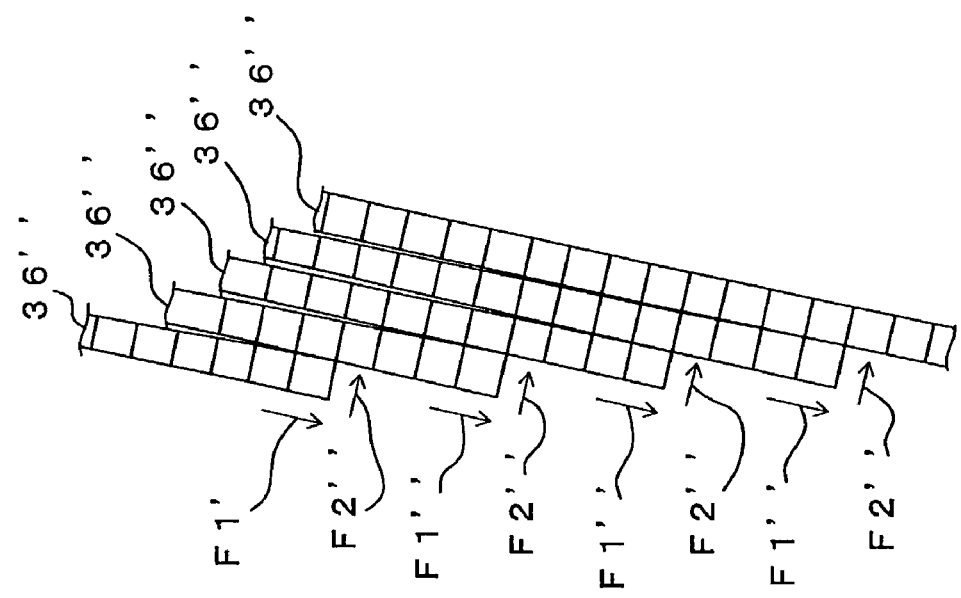
FIGS. 10B and 10C are schematic views other examples of the transfer of the charge signals.
Figure 10B:
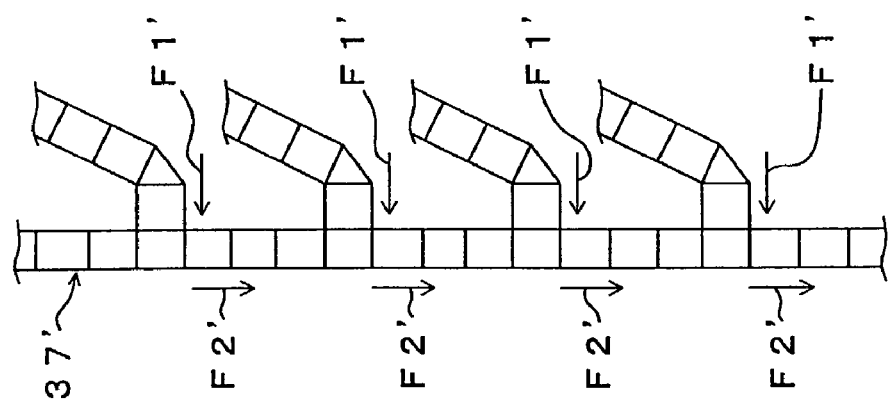
Figure 10A:
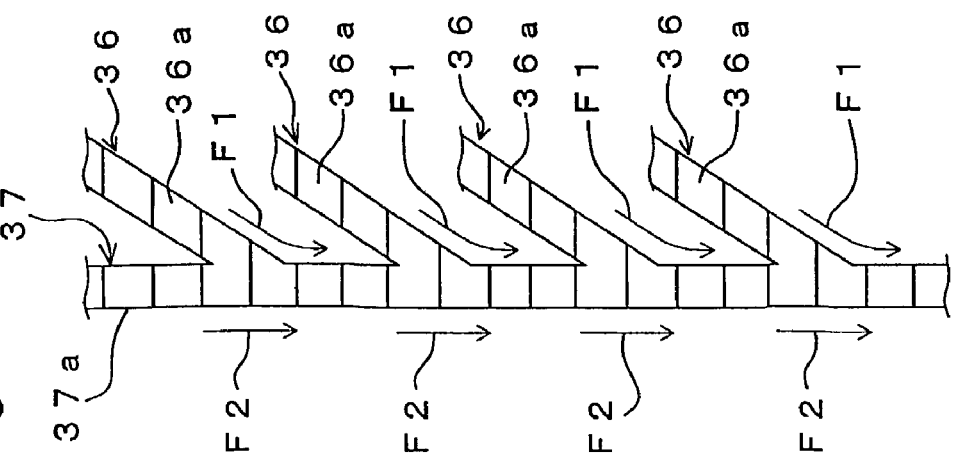
FIG. 10A is a schematic view showing the transfer of charge signals according to the present invention.
Figure 11:
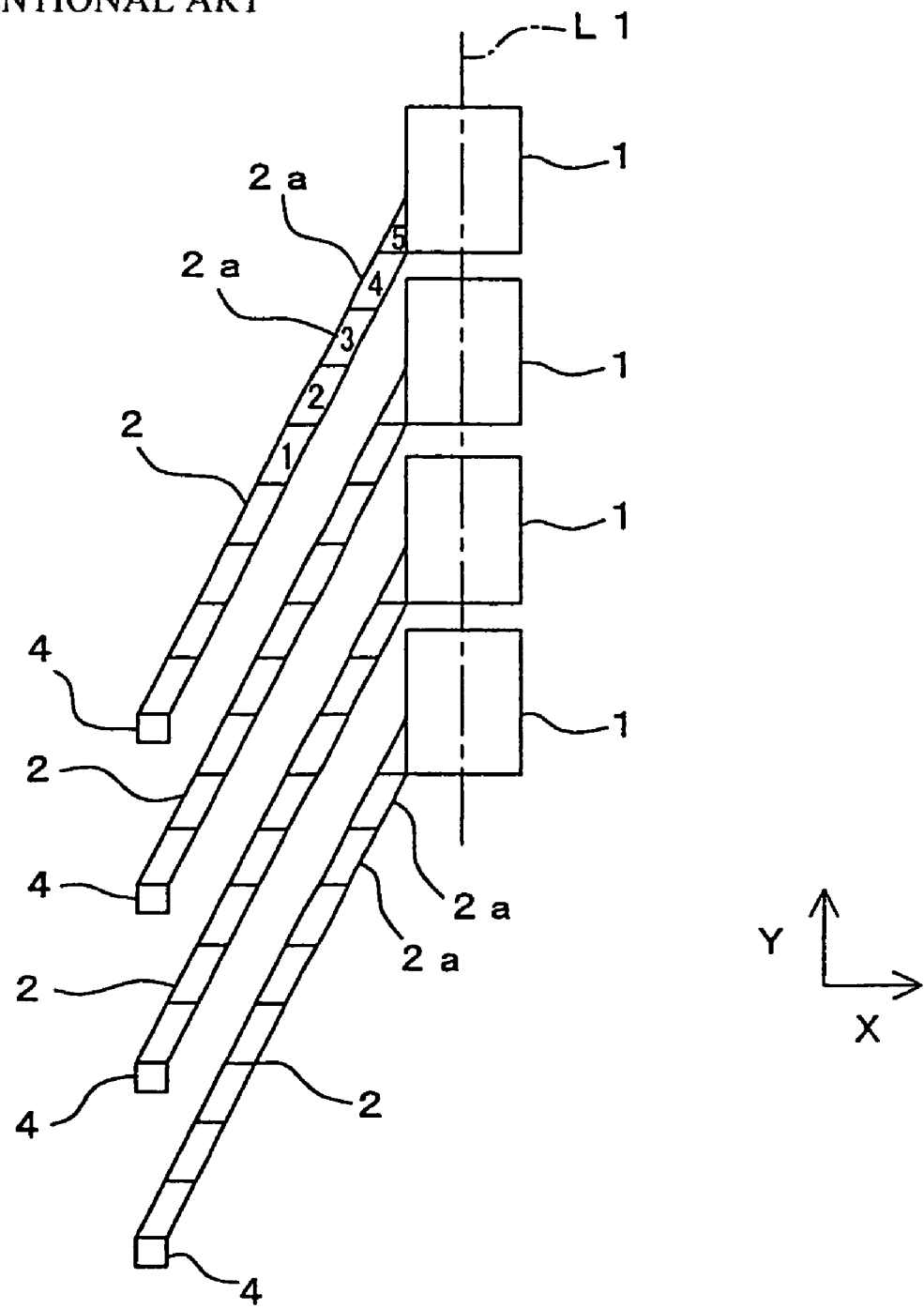
FIG. 11 is a schematic view for describing the principle of a slanted CCD-type image sensor according to a conventional art.
Figure 12:
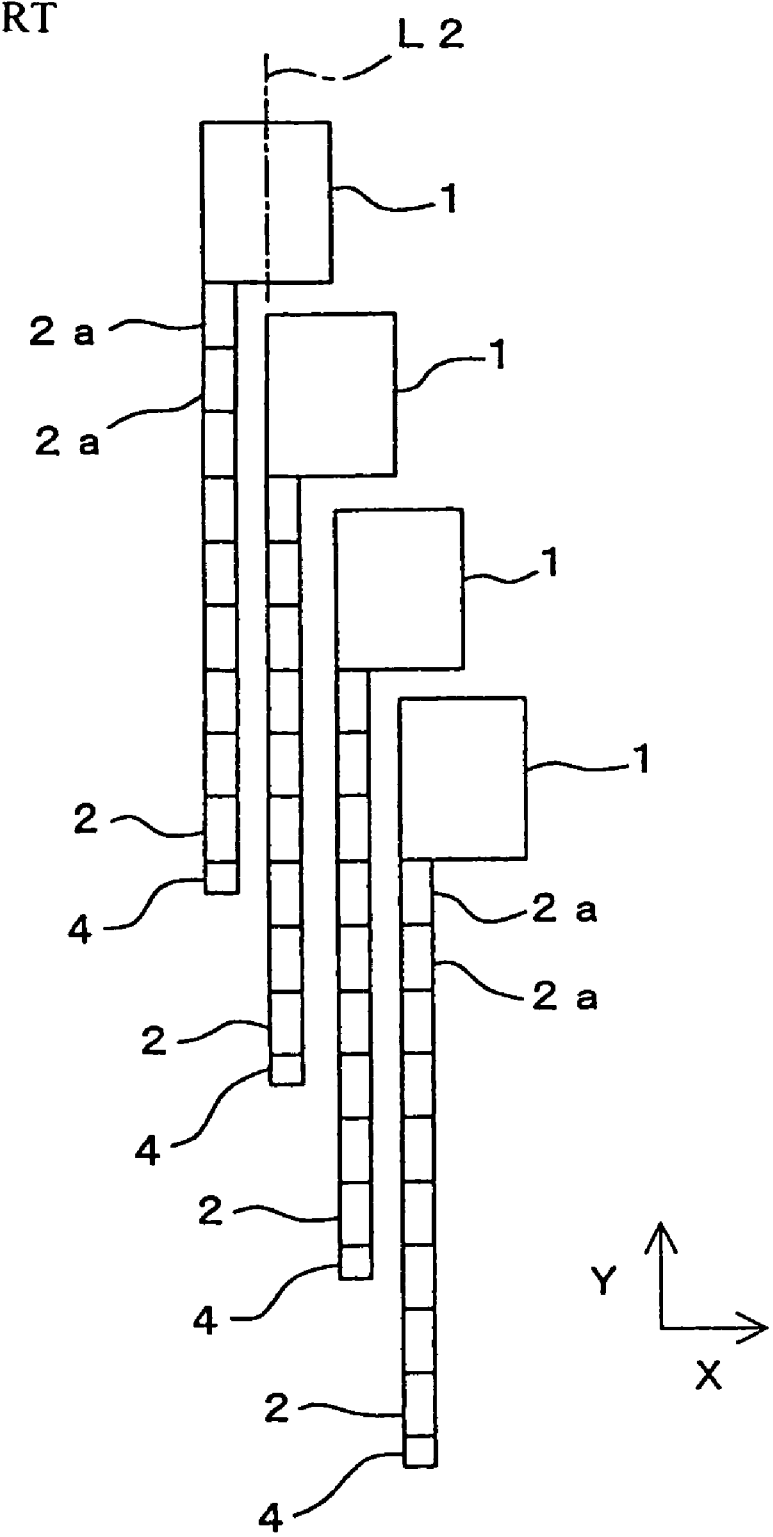
FIG. 12 is a schematic view showing a slanted CCD-type image sensor.

First, in the high speed image sensor 32 of the present embodiment, as shown by arrows F1 and F2 in FIGS. 3 and 10A, the directions of transfer of the charge signals in the CCDs 36 for recording and in the CCDs 37 for vertical read-out are the same at the points where the CCDs 36 for recording merges to the CCDs 37 for vertical read-out. Therefore, the number of metal wires required for the supply of the driving voltages to the CCDs 36 for recording and to the CCDs for vertical read-out can be reduced. For example, in the case that as shown by arrows F1' and F2' in FIG. 10B, the directions of transfer of the charge signals in CCDs 36' for recording and CCDs 37' for vertical read-out are perpendicular to each other at the points of merging, two types of metal wires become necessary in order to change the direction of transfer of the charge signals, causing the creation of an unnecessary space in the photo-receptive area. Further, in the case that as shown in FIG. 10C, the sensor has a configuration wherein charge signals are sequentially transferred from one CCD 36" for recording to another CCD 36" for recording, two types of metal wires are necessary in order to change the direction of transfer of charge signals as shown by the arrows F1" and F2". In contrast to this, since the present embodiment allows one direction of transfer of the charge signals at the point of merging, it is not necessary to provided extra metal wires to change the direction of transfer. For this reason, the number of metal wires in high speed image sensor 32 of the present embodiment can be reduced.

Further, since the control voltage is supplied to the drain gates 45 via the light blocking layer 46 as described above, it is not necessary to provide an additional metal wire for supplying the control voltage to the drain gates. For this reason, the number of metal wires in high speed image sensor 32 of the present embodiment can be reduced.

Furthermore, supply of the driving voltage of phase φ2 to the elements 36a of the CCD 36 for recording and supply of the driving voltage of phase φ2 to the elements 37a of the CCD 37 for vertical read-out is carried out using the same metal wire, i.e., the second metal wire 58. Due to the sharing the metal wire for the supply of the driving voltage for the CCD 36 for recording and for the CCD 37 for vertical read-out, the number of metal wires can be reduced.

As a result of the reduction in the number of metal wires as described above, the distances between first to third metal wires 57, 58 and 59 for supply of the driving voltages can be reduced, so that the time delay in transfer of the driving voltages in the CCDs 36 for recording and the CCDs 37 for vertical read-out can be reduced. As a result, the frame rate is increased.

Further, since in high speed image sensor 32 of the present embodiment, the CCDs 36 for recording are driven by the driving voltage of two phases, the frame rate is increased. Specifically, in the case of a driving voltage of three or more phases, charge signals are transferred from one element to the next element through a change in the driving voltage of three to eight steps. In contrast to this, in the case of the driving voltage of two phases, charge signals are transferred from one element to the next element through a change in the driving voltage of two steps as shown in the steps S0 to S2 in FIG. 8. Therefore, the speed of transfer of the charge signals is increased, resulting in increase of the frame rate.

Concretely, by providing the above described characteristics in the above described embodiment, a frame rate on the order of one million frames per second can be achieved.

Then, reduction in noise and increase in yield will be described.

First, to each of the CCDs 37 for vertical read-out provided for each column of photodiodes 33 or pixels 34, the CCDs 36 connected to photodiodes 33 forming the corresponding column are merged. In this arrangement, as shown in FIG. 7, the CCD 36 for recording does not pass through the narrow gap 148 between the photodiodes adjacent to each other in the columnar direction. Accordingly, noises occurring at the time of transfer of charge signals in the CCDs 36 for recording can be reduced. In addition, charge signals can be read out outside the sensor by the CCDs 37 for vertical read-out without causing noises after the completion of image capture.

Further, as described above, metal wires include only three types, i.e., first to third metal wires 57 to 59, and therefore the number of types of metal wires is few. The small number of types of metal wires reduces total number of metal wires, thereby reducing the noises.

Furthermore, since the number of types and number of metal wires can be reduced as described above, the number of metal layers can be reduced. Specifically, the number of metal layers is two in total, consisting of one layer for arranging the first to third metal wires 57 to 59 and the light blocking layer 46. This reduction in the number of metal layers allows reduction in noise.

The reduction in noise enhances yield.

The present invention is not limited to the above described embodiment and various modifications are possible.

For example, in stead of the photodiode, other photoelectric conversion means such as photogate the surface layer of the photosensitive parts of which is covered with a transparent electrode can be utilized. In addition, charge signal converters may generate charge signals according to radio waves, such as ultraviolet rays, infrared rays, X-rays and gamma rays, or incident beams of flows of particles, such as neutron flows or ion flows.

The sensor may have a parallel read-out structure wherein approximately two to four horizontal read-out CCDs are provided.

Unnecessary charge signals may be discharged from the drain gates through the substrate.

The present invention can be applied to the case wherein the number of metal layers including the light blocking layer is three or more.

In addition, though the above described embodiment adopts two phase drive, the present invention can be applied to the case wherein a driving voltage has three or more phases.

The invention claimed is:

1. A high speed image sensor, comprising:
a plurality of charge signal converters forming rows at constant intervals and columns at constant intervals, arranged in a photo-receptive area so that the row direction and the columnar direction are perpendicular to each other, and respectively generating a charge signal according to an intensity of incident beam;
a plurality of charge signal storages, respectively provided for each of the plurality of charge signal converters with one end thereof being connected to a corresponding charge signal converter, extending linearly so as to be slanted with respect to a line connecting adjacent charge signal converters in the column direction, and transferring charge signals generated by the corresponding charge signal converter from one end to an opposite end; and
a plurality of charge signal transfers, respectively provided for each column of charge signal converters so that the opposite ends of the charge signal storages with the one ends connected to charge signal converters constituting a corresponding column are merged to the charge signal transfer, and transferring charge signals that have been transferred from these charge signal storages to a horizontal transfer that transfers the charge signals to the outside of the photo-receptive area.

2. A high speed image sensor according to claim 1, wherein said charge signal transfers extend in the columnar direction of said charge signal converters.

3. A high speed image sensor according to claim 1, wherein the direction of transfer of charges through said charge signal storages and the direction of transfer of charge through said charge signal transfers are substantially same at points where said charge signal storages merge to said charge signal transfers.

4. A high speed image sensor according to claim 3, wherein said charge signal storages are formed of first charge coupled devices,
wherein said charge signal transfers are formed of second charge coupled devices,
wherein the high speed image sensor is provided with a plurality of electrodes including at least two types for supplying a driving voltage to said first charge coupled devices and a plurality of electrodes including at least two types for supplying a driving voltage to said second charge coupled devices, and
wherein at least one type of the electrode among the electrodes for supplying the driving voltage to said second charge coupled devices is the same electrode as at least one type of the electrode among the electrodes for supplying the driving voltage to said first charge coupled devices.

5. A high speed image sensor according to claim 1, further comprising:
a light blocking layer having a plurality of windows respectively corresponding to individual charge signal converter, each of the window allowing incident beam to be transmitted to said charge signal converter, and a portion of the light blocking layer other than the windows blocking the incident beam;
a plurality of charge signal discharge controllers respectively provided to each of the charge signal storages, and discharging charge signals transferred by the corresponding charge signal storage to the outside of the sensor; and
a control voltage supplier supplying a control voltage to said plurality of charge signal discharge controllers via said light blocking layer.

6. The high speed image sensor according to claim 1,
wherein said charge signal storages are formed of charge coupled devices, and
wherein the high speed image sensor further comprises:
a plurality of metal wires for supplying driving voltages to the charge coupled devices; and
a driving voltage supplier for supplying driving voltages of two phases via said metal wires.

7. An image capturing apparatus comprising the high speed image sensor according to claim 1.

8. A method providing a high speed image sensor, comprising:
creating rows and columns of a plurality of charge signal converters at constant intervals, arranged in a photo-receptive area so that the row direction and the column direction are perpendicular to each other;
creating a plurality of charge signal storages, respectively provided for each of the plurality of charge signal converters with a first end thereof being connected to a corresponding charge signal converter and extending linearly at a slant with respect to a line connecting adjacent charge signal converters in the column direction;
transferring charge signals generated by the corresponding charge signal converter from the first end to a second opposite end;
creating a plurality of charge signal transfers, respectively provided for each column of charge signal converter so that the second opposite end of the charge signal storages are merged to the charge signal transfer; and
transferring charge signals that have been transferred from these charge signal storages to a horizontal transfer that transfers the charge signals to the outside of the photo-receptive area.

* * * * *